(12) United States Patent
Tudorica et al.

(10) Patent No.: US 9,905,735 B1
(45) Date of Patent: Feb. 27, 2018

(54) HIGH BRIGHTNESS, LOW-CRI SEMICONDUCTOR LIGHT EMITTING DEVICES INCLUDING NARROW-SPECTRUM LUMINESCENT MATERIALS

(71) Applicant: Cree, Inc., Durham, NC (US)

(72) Inventors: Florin A. Tudorica, Chapel Hill, NC (US); Brian Thomas Collins, Holly Springs, NC (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 15/475,366

(22) Filed: Mar. 31, 2017

(51) Int. Cl.
*H01L 29/20* (2006.01)
*H01L 21/00* (2006.01)
*H01L 33/50* (2010.01)
*H01L 51/42* (2006.01)

(52) U.S. Cl.
CPC ............ *H01L 33/502* (2013.01); *H01L 51/42* (2013.01)

(58) Field of Classification Search
CPC ..................................................... H01L 33/502
USPC .................................. 438/31–35; 257/88–92
See application file for complete search history.

(56) References Cited

U.S. PATENT DOCUMENTS

| | | | |
|---|---|---|---|
| 7,750,359 B2 * | 7/2010 | Narendran | B82Y 10/00 257/98 |
| 8,921,875 B2 | 12/2014 | LeToquin et al. | |
| 9,537,061 B2 * | 1/2017 | Srivastava | H01L 33/504 257/89 |
| 2016/0372638 A1 | 12/2016 | Todorov et al. | |

OTHER PUBLICATIONS

Ken T. Shimizu et al., "Toward Commercial Realization of Quantum Dot Based White Light-Emitting Diodes for General Illumination," *Photonics Research*, vol. 5, No. 2, Apr. 2017.

\* cited by examiner

*Primary Examiner* — Calvin Lee
(74) *Attorney, Agent, or Firm* — Myers Bigel, P.A.

(57) ABSTRACT

A semiconductor light emitting device includes an LED and a recipient luminophoric medium that includes a first narrow-spectrum luminescent material that down-converts a first portion of the radiation emitted by the LED to radiation having a first peak wavelength in the green-yellow color range and a second narrow-spectrum luminescent material that down-converts a second portion of the radiation emitted by the LED to radiation having a second peak wavelength in an orange-red color range. The first and second luminescent materials and any additional narrow-spectrum luminescent materials that are included in the recipient luminophoric medium generate at least 80% of the light emitted by the recipient luminophoric medium. A CRI value of the combined light emitted by the semiconductor light emitting device is at least 60 and less than 80.

21 Claims, 13 Drawing Sheets

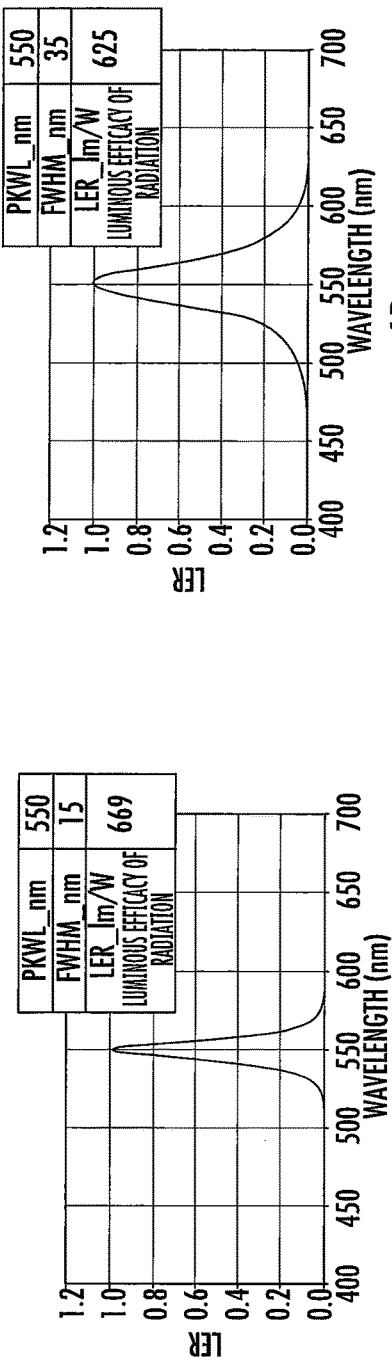
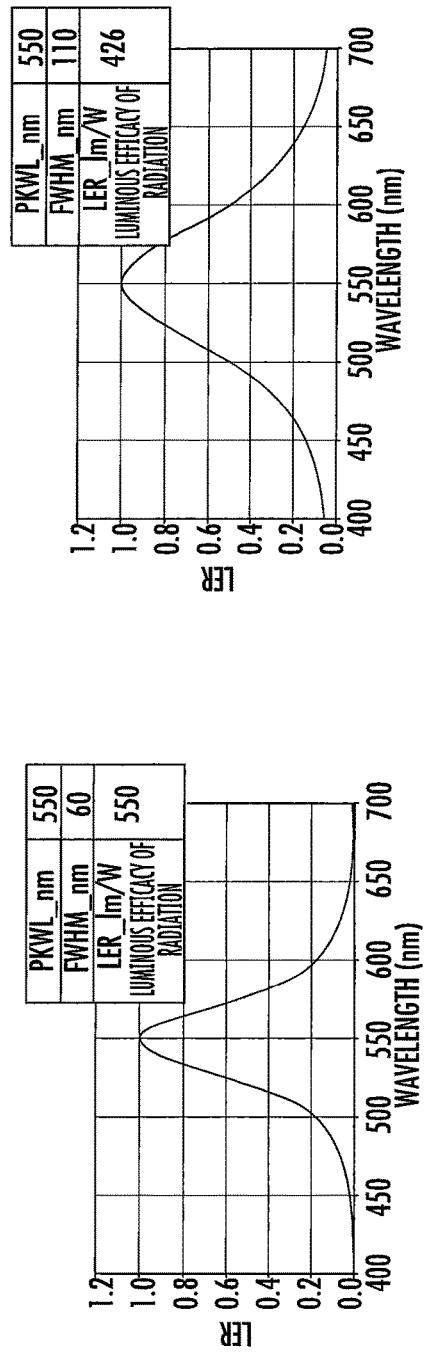
FIG. 4A
FIG. 4B
FIG. 4C
FIG. 4D

HIGH BRIGHTNESS, LOW-CRI SEMICONDUCTOR LIGHT EMITTING DEVICES INCLUDING NARROW-SPECTRUM LUMINESCENT MATERIALS

BACKGROUND

The present invention relates to light emitting devices and, more particularly, to semiconductor light emitting devices that include recipient luminophoric mediums. As used herein, the term "semiconductor light emitting device" refers to a light emitting device that includes at least one light emitting diode ("LED"). Example semiconductor light emitting devices include packaged lamps, light bulbs, streetlights, downlights, ceiling-mounted troffers or various other light fixtures that include one or more LEDs.

A wide variety of light emitting devices are known in the art including, for example, incandescent light bulbs, fluorescent lights and semiconductor light emitting devices that include one or more LEDs. LEDs generally include a series of semiconductor layers that may be epitaxially grown on a substrate such as, for example, a sapphire, silicon, silicon carbide, gallium nitride or gallium arsenide substrate. One or more semiconductor p-n junctions are formed in these epitaxial layers. When a sufficient voltage is applied across the p-n junction, electrons in the n-type semiconductor layers and holes in the p-type semiconductor layers flow toward the p-n junction. As the electrons and holes flow toward each other, some of the electrons will "collide" with corresponding holes and recombine. Each time this occurs, a photon of light is emitted, which is how LEDs generate light. The wavelength distribution of the light generated by an LED generally depends on the semiconductor materials used and the structure of the thin epitaxial layers that make up the region of the device where the electrons and holes recombine.

Most LEDs (chips/die) are nearly monochromatic light sources that appear to emit light having a single color (usually blue). Thus, the spectral power distribution of the light emitted by most LEDs is tightly centered about a "peak" wavelength, which is the wavelength where the spectral power distribution or "emission spectrum" of the LED reaches its maximum as detected by a photo-detector. The "spectral width" (i.e., the power of the emission as a function of wavelength) of the spectral power distribution of most LEDs is between about 10 nm and 30 nm, where the spectral width is measured at half the maximum illumination on each side of the emission spectrum (this spectral width is referred to as the full-width-half-maximum or "FWHM" spectral width).

White light is desired for many applications, and particularly for applications in which incandescent and/or fluorescent bulbs (both of which emit white light) have traditionally been used. Semiconductor light emitting devices are now widely available that produce white light. One technique for generating white light using almost monochromatic LEDs is to provide a device that includes several LEDs that each emit a light of a different color. The different colored light emitted by the LEDs may combine to produce light that is white or near-white in color. For example, by simultaneously energizing red, green and blue LEDs, the resulting combined light may appear white, or nearly white, depending on, for example, the relative intensities, peak wavelengths and spectral power distributions of the source red, green and blue LEDs.

White light may also be produced by surrounding a single blue or ultraviolet LED with one or more luminescent materials such as phosphors that convert some of the light emitted by the LED to light of one or more other colors. The combination of the light emitted by the LED that is not converted by the luminescent material(s) and the light of other colors that are emitted by the luminescent material(s) may produce a white or near-white light.

As an example, a white light emitting semiconductor light emitting device may be formed by coating a gallium nitride-based blue LED (i.e., an LED that emits light having a peak wavelength in the blue color range as defined herein) with a yellow luminescent material such as a cerium-doped yttrium aluminum garnet phosphor, which has the chemical formula $Y_3Al_5O_{12}$:Ce, and is commonly referred to as YAG:Ce. The blue LED emits light having an emission with a peak wavelength of, for example, between 440-450 nm. Some of blue light emitted by the LED passes between and/or through the YAG:Ce phosphor particles without being down-converted, while other of the blue light emitted by the LED is absorbed by the YAG:Ce phosphor, which becomes excited and emits light with a peak wavelength of about 550 nm and a FWHM spectral width of about 115 nm. The combination of blue light emitted by the LED that is not converted by the phosphor along with the green, yellow, orange and red light emitted by the YAG:Ce phosphor may appear white to an observer. Such light is typically perceived as being cool white in color, as it is primarily comprises light on the lower half (shorter wavelength side) of the visible emission spectrum. To make the emitted white light appear more "warm" and/or exhibit better color rendering properties, red-light emitting luminescent materials such as $Eu^{2+}$ doped $CaAlSiN_3$ based phosphor particles may be added to the coating applied to the blue LED.

The above-described approaches for generating white light may also be combined. For example, semiconductor light emitting devices are widely available that include one or more blue LEDs that are coated with a phosphor that emits light having a peak wavelength in the yellow or green color ranges along with one or more additional LEDs that emit light having a peak wavelength in the red color range.

In general, luminescent materials may absorb light having first wavelengths and re-emit light having second wavelengths that are different from the first wavelengths. For example, "down-conversion" luminescent materials may absorb light having shorter wavelengths and re-emit light having longer wavelengths. Phosphors are one type of luminescent material that are widely used to convert a single-color (typically blue or violet) LED into a broader white light spectrum. However, it will be appreciated that other luminescent materials may be used that absorb light at one wavelength and re-emit light at a different wavelength in the visible spectrum such as nanophosphors, quantum dots, scintillators, day glow tapes, and inks that glow in the visible spectrum upon illumination with (e.g., ultraviolet) light.

A medium that includes one or more luminescent materials that is positioned to receive light that is emitted by an LED or other semiconductor light emitting device is referred to herein as a "recipient luminophoric medium." Exemplary recipient luminophoric mediums include layers having luminescent materials that are coated or sprayed directly onto a semiconductor light emitting device or on surfaces of the packaging thereof, and clear encapsulants (e.g., epoxy-based or silicone-based curable resin) that include luminescent materials that are arranged to partially or fully cover a semiconductor light emitting device. A recipient luminophoric medium may include one medium layer or the like in which one or more luminescent materials are mixed, multiple stacked layers or mediums, each of which may include one or more of the same or different luminescent materials, and/or multiple spaced apart layers or mediums, each of which may include the same or different luminescent materials.

SUMMARY

Pursuant to some embodiments of the present invention, semiconductor light emitting devices are provided that include an LED and a recipient luminophoric medium that includes a first narrow-spectrum luminescent material that down-converts a first portion of the radiation emitted by the LED to radiation having a first peak wavelength in the green-yellow color range and a second narrow-spectrum luminescent material that down-converts a second portion of the radiation emitted by the LED to radiation having a second peak wavelength in an orange-red color range. The first and second luminescent materials and any additional narrow-spectrum luminescent materials that are included in the recipient luminophoric medium generate at least 80% of the light emitted by the recipient luminophoric medium. A CRI value of the combined light emitted by the semiconductor light emitting device is at least 60 and less than 80.

In some embodiments, the recipient luminophoric medium may not include any luminescent materials that have a full-width half maximum spectral width that exceeds 70 nanometers.

In some embodiments, the full-width half maximum spectral width of the first luminescent material and/or of the second luminescent material may be less than 40 nanometers.

In some embodiments, a peak emission power of the first luminescent material when excited by light from the LED may be less than a peak emission power of the second luminescent material when excited by light from the LED. In some such embodiments, a peak emission power of the light emitted by the LED that passes through the recipient luminophoric medium may also be less than a peak emission power of the second luminescent material when excited by light from the LED. A peak emission power of the light emitted by the LED that passes through the recipient luminophoric medium may also or alternatively be less than a peak emission power of the first luminescent material when excited by light from the LED.

In some embodiments, the first and second luminescent materials may be the only luminescent materials included in the recipient luminophoric medium. In such embodiments, wherein the peak wavelength of the second luminescent material may be between 60-70 nanometers greater than the peak wavelength of the first luminescent material.

In some embodiments, the CRI value of the combined light emitted by the semiconductor light emitting device may be between 69 and 75. IN such embodiments, the light output by the semiconductor light emitting device may have a correlated color temperature of between 3900 K and 5700 K (or between 3900 K and 5000 K in other embodiments).

In some embodiments, the peak wavelength of the second luminescent material may be between 595 nm and 612 nm and/or the peak wavelength of the first luminescent material may be between 530 nm and 548 nm.

Pursuant to further embodiments of the present invention, semiconductor light emitting devices are provided that include an LED and a recipient luminophoric medium that is configured to down-convert at least some of the light emitted by the LED. The recipient luminophoric medium includes at least a first luminescent material that down-converts a first portion of the radiation emitted by the LED to radiation having a peak wavelength that is in a green-yellow color range, the first luminescent material having a full-width half maximum spectral width of at least 80 nanometers and one or more second luminescent materials that each down-convert a second portion of the radiation emitted by the LED to radiation having a peak wavelength that is in an orange-red color range, each second luminescent material having a full-width half maximum spectral width of less than 45 nanometers. The one or more second luminescent materials generate at least 80% of the light emitted by luminescent materials included in the recipient luminophoric medium that have peak wavelengths above 590 nm. A peak emission of the first luminescent material when excited by light from the LED exceeds a peak emission of each second luminescent material when excited by light from the LED. A CRI value of the combined light emitted by the semiconductor light emitting device is at least 60 and less than 80.

In some embodiments, the emission power of each second luminescent material when excited by light from the LED may be less than the emission power of the first luminescent material when excited by light from the LED at all wavelengths in the visible light spectrum.

In some embodiments, the first luminescent material and the one or more second luminescent material may be the only luminescent materials included in the recipient luminophoric medium.

In some embodiments, the semiconductor light emitting device may only include a single second luminescent material, and the peak wavelength of the second luminescent material may be between 60-70 nanometers greater than the peak wavelength of the first luminescent material.

In some embodiments, the CRI value of the combined light emitted by the semiconductor light emitting device may be between 69 and 75.

In some embodiments, the semiconductor light emitting device may only include a single second luminescent material, and the peak wavelength of the second luminescent material may be between 595 nm and 612 nm.

In some embodiments, the light output by the semiconductor light emitting device may have a correlated color temperature of between 3900 K and 5700 K (or between 3900 K and 5000 K in other embodiments).

In some embodiments, the peak wavelength of the first luminescent material may be between 530 nm and 548 nm.

Pursuant to still further embodiments of the present invention, semiconductor light emitting devices are provided that include an LED and a recipient luminophoric medium that is configured to down-convert at least some of the light emitted by the LED. The recipient luminophoric medium includes a first luminescent material that down-converts a first portion of the radiation emitted by the LED to radiation having a first peak wavelength that is in a green-yellow color range, the first luminescent material having a full-width half maximum spectral width of less than 45 nanometers and a second luminescent material that down-converts a second portion of the radiation emitted by the LED to radiation having a second peak wavelength that is in an orange-red color range, the second luminescent material having a full-width half maximum spectral width of less than 45 nanometers. A peak emission power of the light emitted by the LED that passes through the recipient luminophoric medium is less than a peak emission power of the first luminescent material when excited by light from the LED and is less than a peak emission power of the second luminescent material when excited by light from the LED. A CRI value of the combined light emitted by the semiconductor light emitting device is at least 60 and less than 80. The first and second luminescent materials are the only luminescent materials included in the recipient luminophoric medium.

In some embodiments, the peak wavelength of the second luminescent material may be between 60-70 nanometers greater than the peak wavelength of the first luminescent material.

In some embodiments, the CRI value of the combined light emitted by the semiconductor light emitting device may be between 69 and 75.

In some embodiments, the peak wavelength of the second luminescent material may be between 595 nm and 612 nm.

In some embodiments, the light output by the semiconductor light emitting device may have a correlated color temperature of between 3900 K and 5700 K.

In some embodiments, the peak wavelength of the first luminescent material may be between 530 nm and 548 nm.

BRIEF DESCRIPTION OF THE DRAWINGS

FIGS. 4A-4D are graphs illustrating how using luminescent materials having narrower emission spectra may be used to provide high-brightness, low-CRI semiconductor light emitting device having increased luminous efficacy.

DETAILED DESCRIPTION

The present invention is directed to high-brightness semiconductor light emitting devices for applications requiring relatively low color rendering index or "CRI" values such as CRI values between 60 and 79.5 and/or between 69 and 75. The semiconductor light emitting devices according to embodiments of the present invention have recipient luminophoric mediums that include one or more narrow-spectrum luminescent materials. These semiconductor light emitting devices may provide enhanced brightness in low-CRI applications while otherwise matching or exceeding other performance parameters of conventional state-of-the-art high-brightness, low-CRI semiconductor light emitting devices.

Semiconductor light emitting devices according to embodiments of the invention may include III-V nitride (e.g., gallium nitride) based LEDs fabricated on a silicon carbide, sapphire or gallium nitride substrates such as various devices manufactured and/or sold by Cree, Inc. of Durham, N.C. Such LEDs may (or may not) be configured to operate such that light emission occurs through the growth substrate (or a semiconductor layer that was near the growth substrate if the growth substrate is removed) in a so-called "flip chip" orientation. Semiconductor light emitting devices according to embodiments of the present invention include both vertical devices with a cathode contact on one side of the LED, and an anode contact on an opposite side of the LED and devices in which both contacts are on the same side of the device. The design and fabrication of LEDs are well known to those skilled in the art, and hence further description thereof will be omitted.

Visible light may include light having many different wavelengths. The apparent color of visible light can be illustrated with reference to a two-dimensional chromaticity diagram, such as the 1931 CIE Chromaticity Diagram illustrated in FIG. 1. Chromaticity diagrams provide a useful reference for defining colors as weighted sums of colors.

Figure 1:
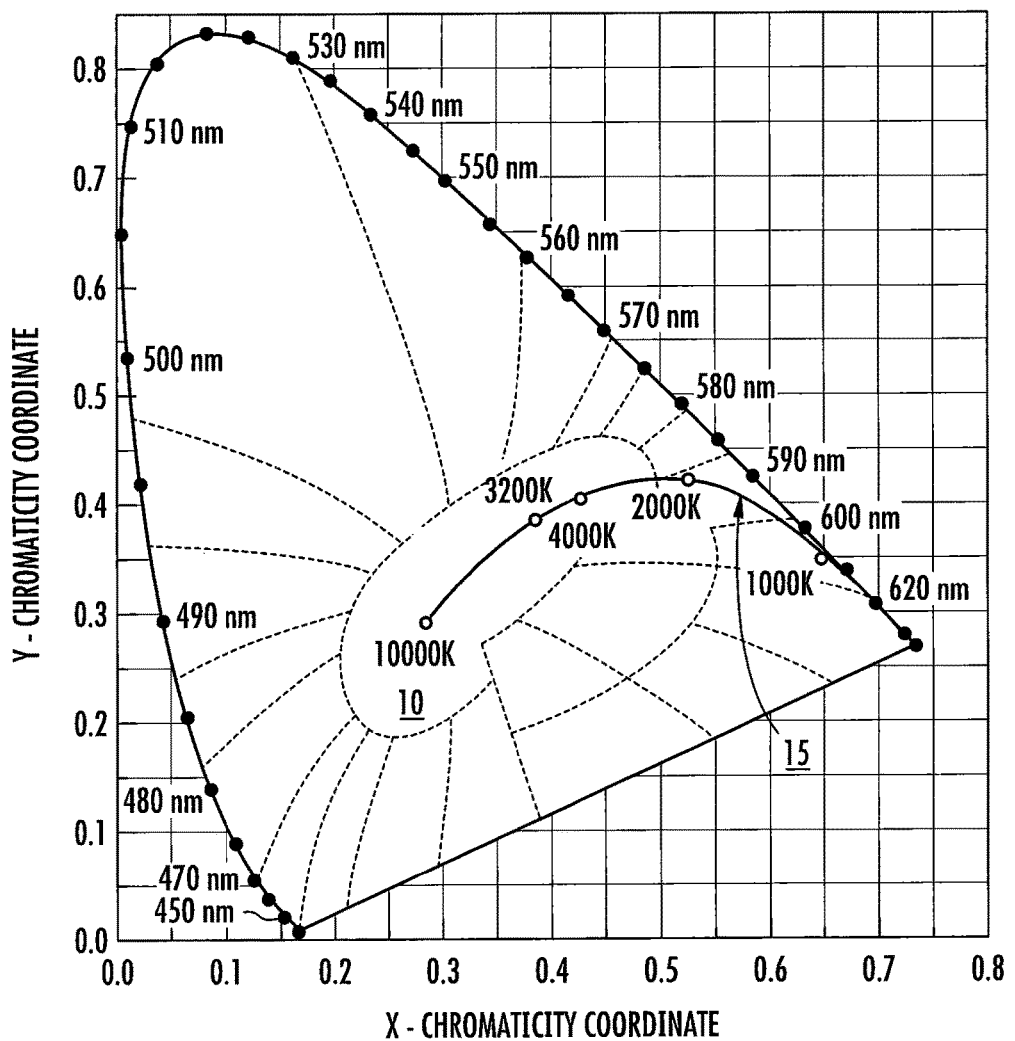
FIG. 1 is a graph of a 1931 CIE Chromaticity Diagram illustrating the location of the black body locus.

As shown in FIG. 1, colors on a 1931 CIE Chromaticity Diagram are defined by x and y chromaticity coordinates that fall within a generally U-shaped area. Colors on or near the outside of the area are saturated colors composed of light having a single wavelength, or a very small wavelength distribution. Colors on the interior of the area are unsaturated colors that are composed of a mixture of different wavelengths. White light, which can be a mixture of many different wavelengths, is generally found near the middle of the diagram, in the region labeled 10 in FIG. 1. There are many different hues and temperatures of light that may be considered "white," as evidenced by the size of the region 10. For example, some "white" light, such as light generated by sodium vapor lighting devices, may appear yellowish in color, while other "white" light, such as light generated by some fluorescent lighting devices, may appear more bluish in color.

A binary combination of light from light sources emitting light of first and second colors may appear to have a different color than either of the two constituent colors. The color of the combined light may depend on the wavelengths and relative intensities of the two light sources. For example, light emitted by a combination of a blue source and a red source may appear purple or magenta to an observer. Similarly, light emitted by a combination of a blue source and a yellow source may appear white to an observer.

Each point in the graph of FIG. 1 is referred to as the "color point" of a light source that emits a light having that color. As shown in FIG. 1 a locus of color points that is referred to as the "black-body" locus 15 exists which corresponds to the location of color points of light emitted by a black-body radiator that is heated to various temperatures. The black-body locus 15 is also referred to as the "planckian" locus because the chromaticity coordinates (i.e., color points) that lie along the black-body locus obey Planck's equation: $E(\lambda)=A\ \lambda^{-5}/(e^{B/T}-1)$, where E is the emission intensity, $\lambda$ is the emission wavelength, T is the color temperature of the black-body and A and B are constants. Color coordinates that lie on or near the black-body locus 15 yield pleasing white light to a human observer.

As a heated object becomes incandescent, it first glows reddish, then yellowish, and finally bluish with increasing temperature. This occurs because the wavelength associated with the peak radiation of the black-body radiator becomes progressively shorter with increased temperature, consistent with the Wien Displacement Law. Illuminants that produce light which is on or near the black-body locus 15 can thus be described in terms of their correlated color temperature ("CCT"). As used herein, the term "white light" refers to light that is perceived as white, is within 7 MacAdam ellipses of the black-body locus on a 1931 CIE chromaticity diagram, and has a CCT ranging from 2000K to 10,000K. White light with a CCT of 4000K may appear yellowish in color, while white light with a CCT of 8000K or more may appear more bluish in color, and may be referred to as "cool" white light. "Warm" white light may be used to describe white light with a CCT of between about 2500K and 4500K, which is more reddish or yellowish in color.

The ability of a light source to accurately reproduce color in illuminated objects is typically characterized by its color rendering index or "CRI." The CRI of a light source is a modified average of relative measurements of how the color rendition of an illumination system compares to that of a reference black-body radiator when illuminating eight reference colors. Thus, the CRI is a relative measure of the shift in surface color of a test object when lit by a particular lamp. The CRI equals 100 if the color coordinates of a set of test colors being illuminated by the illumination system are the same as the coordinates of the same test colors being irradiated by the black-body radiator. Daylight generally has a CRI of nearly 100, incandescent bulbs have a CRI of about 95, fluorescent lighting typically has a CRI of about 70 to 85, while monochromatic light sources have a CRI of essentially zero.

Light sources for general illumination applications with a CRI of less than 50 are generally considered very poor and are typically only used in applications where economic issues preclude other alternatives. Light sources with a CRI value between 70 and 80 have application for general illumination where the colors of objects are not of primary importance. For backlight, general illumination and various other applications, it is often desirable to provide a lighting source that generates white light having a relatively high CRI, so that objects illuminated by the lighting source may appear to have more natural coloring to the human eye. Accordingly, light sources having a CRI value that exceeds 80, and more preferably 85, are typically used for general illumination purposes. Light sources with CRI values of more than 90 provide greater color quality.

Another important performance parameter for a semiconductor light emitting device is the intensity of the light emitted, which is referred to as the "radiant flux" of the device. However, as the human eye has varying sensitivity to different wavelengths of light, the intensity of the light emitted by a lighting source is most typically measured in terms of the lighting source's "luminous flux," which is a measure of the power of the light emitted by a light source as perceived by a human observer. The luminous flux of a light source is typically measured in lumens (lm). The luminous flux of a light source differs from the radiant flux of the light source in that the radiant flux measures the total power emitted, while the luminous flux weights the power of the light emitted at each wavelength based on a luminosity function which represents the response of the human eye for each different wavelength.

Figure 2:
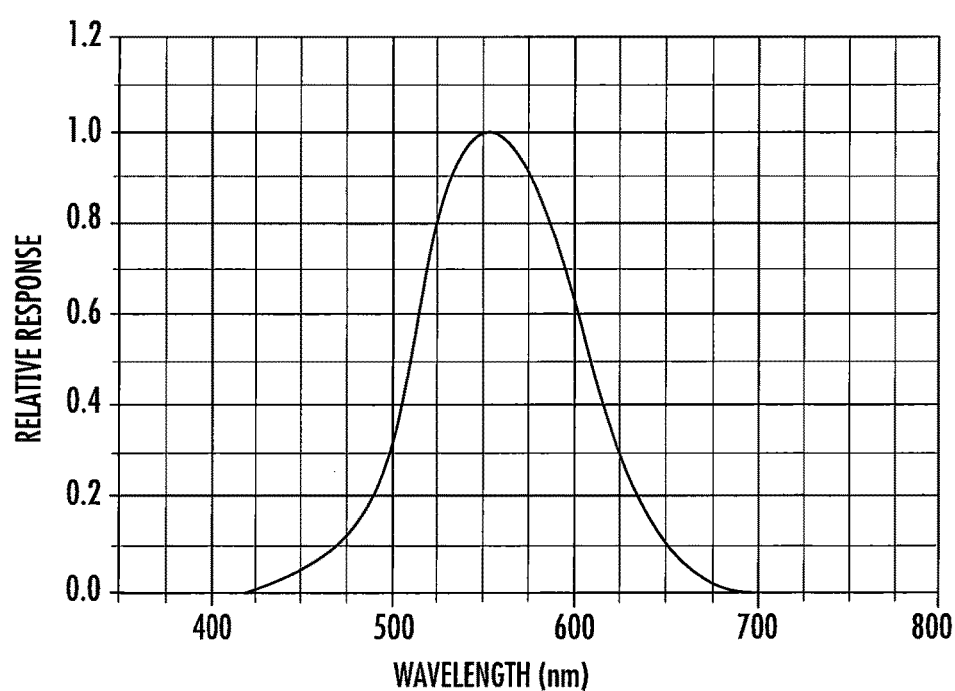
FIG. 2 is a graph illustrating the response of the human eye to light in the visible light spectrum.

FIG. 2 is a graph of the above-referenced luminosity function that corresponds to the response of the human eye to light in the visible light spectrum. As shown in FIG. 2, the human eye cannot perceive light at wavelengths below about 400 nanometers and above about 700 nanometers. The maximum response of the human eye to light occurs at about 555 nanometers. In calculating luminous flux, the radiant flux of a light source is weighted based on the eye sensitivity curve of FIG. 2. As the amount of light emitted by an LED is generally a function of the power input to the LED, the luminous flux performance of semiconductor light emitting devices are typically compared with each device being driven at the same input power level or, alternatively, the devices may be compared in terms of the luminous flux per unit of input power (e.g., lumens per Watt) that each device emits at the input power level for which each device is designed to operate. The luminous flux per unit of input power is referred to herein as the luminous efficacy of a semiconductor light emitting device.

Because of the varying sensitivity of the human eye to light of different wavelengths, there tends to be a tradeoff between the luminous efficacy of the light emitted by a semiconductor light emitting device and the CRI of the light emitted. For example, since the human eye is most sensitive to light at a wavelength of about 555 nm, a monochromatic light source at 555 nm would exhibit a high luminous flux value. However, in order to obtain high CRI values, it is generally necessary to have light contribution across a wide range of wavelengths, including wavelengths that are relatively far away from 555 nm where the peak sensitivity of light to the human eye occurs. Because the human eye has reduced sensitivity to the wavelengths on either end of the visible light spectrum, the light contributions that are often added to improve the CRI of a device may result in a decrease in the luminous efficacy of the device.

Embodiments of the present invention are directed to semiconductor light emitting devices that have recipient luminophoric mediums that include luminescent materials that have peak emission wavelengths in various color ranges. For purposes of this disclosure, the various color ranges of visible light are defined as shown in Table 1 below. It will be appreciated, however, that there are not sharp boundaries between different colors of the spectrum. For example, light having wavelengths from 430-450 nm may appear blue-violet, while light having wavelengths from 540-560 nm may appear yellow-green, etc.

TABLE 1

| Color | Wavelength Range (nm) |
|---|---|
| Blue | 440-479 |
| Cyan | 480-510 |
| Green | 511-549 |
| Yellow | 550-585 |
| Orange | 586-604 |
| Red | 605-700 |

It will also be appreciated that the above color ranges may be combined to define color ranges having a larger span of wavelengths. For example, the green-yellow color range refers to light having wavelengths in the range from 511-585 nm and the orange-red color range refers to light having wavelengths in the range from 586-700 nm.

An LED or a luminescent material that emits light having a peak wavelength in one of the above color ranges may be referred to with reference to the color range. By way of example, a phosphor that emits light having a peak wavelength of 630 nanometers may be referred to herein as a "red phosphor," while an LED that emits light having a peak wavelength of 460 nanometers may be referred to as a "blue LED."

Phosphors and other luminescent materials may, when excited, emit light over a broad range of wavelengths or over a narrower range of wavelengths. Herein, luminescent materials having emission spectrums that have FWHM spectral widths of 80 nanometers or more are referred to as "broad-spectrum" luminescent materials. In contrast, luminescent materials that, when excited, emit light having FWHM spectral widths of less than 70 nanometers or less are referred to "narrow-spectrum" luminescent materials. The sub-set of narrow-spectrum luminescent materials that have FWHM spectral widths of less than 40 nanometers may also be referred to as "very narrow" emission luminescent materials herein.

Figure 3A:
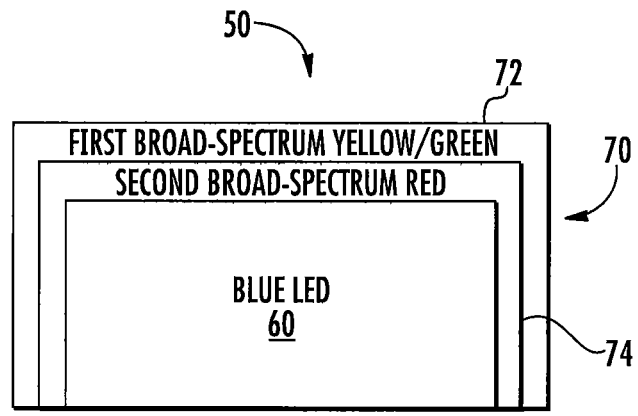
FIG. 3A is a schematic cross-sectional view of a conventional, state-of-the-art, high-brightness, low-CRI semiconductor light emitting device.

FIG. 3A is a schematic cross-sectional view of a conventional, state-of-the-art, high-brightness, low-CRI semiconductor light emitting device 50. As shown in FIG. 3A, the semiconductor light emitting device 50 includes a blue LED 60 and a recipient luminophoric medium 70. The recipient luminophoric medium 70 includes a first broad-spectrum $Y_3Al_5O_{12}$:Ce phosphor that emits light having peak wavelength of about 550 nm (which may be in the green color range or the yellow color range depending upon the exact peak wavelength) and a second broad-spectrum red $(Ca_{1-x}Sr_x)SiAlN_3$:Eu$^{2+}$ phosphor. The semiconductor light emitting device 50 may emit white light that is close to the black body locus that has a correlated color temperature of about 4000 K. Such light falls around the boundary between the E5 and E6 color bins on the 1931 Chromaticity Diagram.

Figure 3B:
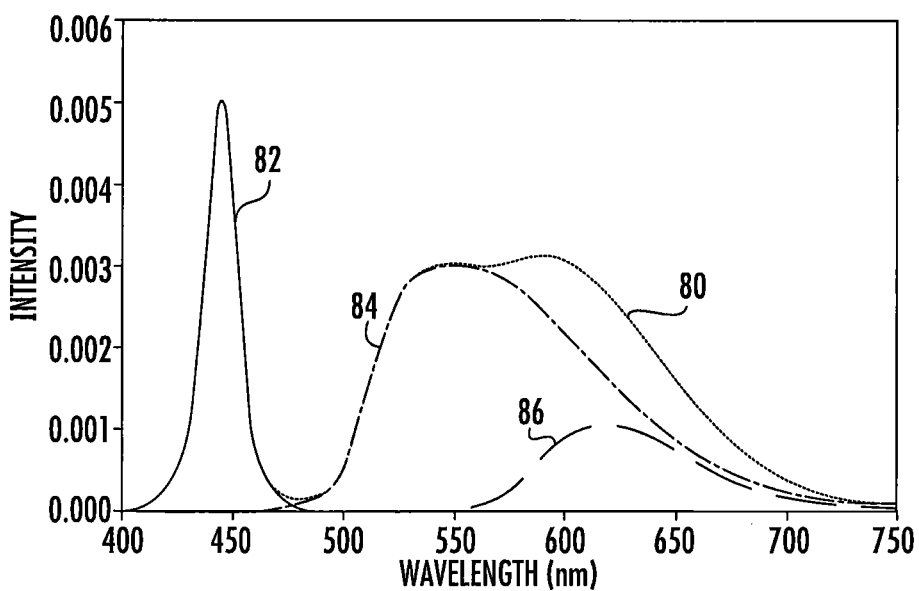
FIG. 3B is a graph illustrating the intensity of the radiation emitted as a function of wavelength by the conventional, state-of-the-art, high-brightness, low-CRI semiconductor light emitting device of FIG. 3A.

FIG. 3B is a graph illustrating the intensity of the emission spectrum 80 (i.e., the radiation emitted as a function of wavelength) for the conventional semiconductor light emitting device 50. In FIG. 3B, the curves 82, 84, 86 represent the contributions to the emission spectra of the emissions of the blue LED, the YAG:Ce phosphor and the red emitter, respectively. The curve 80 represents the combined emission spectra for the semiconductor light emitting device 50. As shown in FIG. 3B, the emission spectrum for the above-described conventional state-of-the-art warm white semiconductor light emitting device 50 has a peak around 450 nanometers that corresponds to the light emitted by the blue LED that passes through the recipient luminophoric medium without being absorbed by the phosphors. The emission spectrum further includes a broad peak (resulting from the merging of two individual broad peaks) extending from about 500-650. While FIGS. 3A and 3B illustrate the phosphors being separated into different layers, it will be appreciated that they may alternatively be mixed together in a single layer.

The conventional semiconductor light emitting device 50 may be designed to maximize brightness while meeting a relatively low, minimum CRI target such as a CRI of 70. As shown in FIG. 3B, substantially more emission is provided from the YAG:Ce phosphor than the broadband red phosphor. This helps maximize brightness by concentrating as much of the emission as possible in the portion of the eye response curve of FIG. 2 where humans perception of light is the highest. The amount of red phosphor added may be just enough to meet the minimum CRI target.

U.S. Pat. No. 8,921,875 ("the '875 patent") proposes other white light emitting semiconductor light emitting devices which include a green and/or yellow broad-spectrum phosphor, a broad-spectrum red phosphor and a narrow-spectrum red phosphor. The '875 patent explains that red phosphors generally can be classified into two categories, namely stable and unstable phosphors. The more unstable red phosphors are BOSE, sulfides and other non-nitride phosphors, while the more stable red phosphors are nitride-based phosphors such as the above-referenced $(Ca_{1-x}Sr_x)SiAlN_3$:Eu$^{2+}$ phosphor. The nitride-based red phosphors are typically characterized by broad emission spectrums (e.g., FWHM spectral widths of greater than 80 nm).

The '875 patent teaches that nitride-based red phosphors that have lower peak wavelengths (e.g., between about 610 nm and about 629 nm) and generally narrower emission spectrum (e.g., FWHM spectral widths of between 60 nm and 80 nm) may be used in place of the above-described higher peak wavelength nitride-based red phosphors to provide improved performance. In particular, the '875 patent teaches that the use of lower peak wavelength red phosphors reduces the Stoke's shift (i.e., the difference between the peak wavelength of the light absorbed by the phosphor and the peak wavelength of the light emitted by the phosphor), which is beneficial as large Stoke's shift values can limit the conversion efficiency of a phosphor (i.e., the percentage of incident light that is absorbed by the phosphor that is actually converted to light that is output by the phosphor). The '875 patent further explains that narrow-spectrum luminescent materials may be used as a means of filling in gaps in the emission spectrum such as, for example, a gap that may appear between the peak emission wavelength of a broad-spectrum yellow phosphor and the peak emission wavelength of a broad-spectrum red phosphor. The '875 patent was focused on providing high-CRI semiconductor light emitting devices.

Pursuant to embodiments of the present invention, semiconductor light emitting devices are provided for use in low-CRI applications that emit white light having improved luminous efficacy without sacrificing performance in terms of color rendering or the color point of the device. In some embodiments, the semiconductor light emitting devices according to embodiments of the present invention may provide an increase in luminous efficacy of 10-15% as compared to conventional state-of-the-art high-brightness, low-CRI semiconductor light emitting devices.

In some embodiments, the semiconductor light emitting devices may include one or more LEDs and a recipient luminophoric medium that includes a first broad-spectrum luminescent material that emits light having a peak wavelength in the green or yellow color ranges, and at least one second narrow-spectrum luminescent material. Each second narrow-spectrum luminescent material emits light having a peak wavelength in the orange or red color ranges. The first broad-spectrum luminescent material may have an FWHM spectral width of at least 80 nanometers, while each second luminescent material may have a FWHM spectral width of less than 45 nanometers. The one or more second narrow-spectrum luminescent materials may generate at least 80% of the light emitted by luminescent materials included in the recipient luminophoric medium that have peak wavelengths above 590 nm. In other words, the semiconductor light emitting device includes at least one second narrow-spectrum luminescent material that emits light having peak wavelengths in the orange or red color ranges, and includes no or only a small amount of any broad-spectrum luminescent material that emits light having a peak wavelength in the orange or red color ranges. In some embodiments, the first and second luminescent materials are the only luminescent materials included in the recipient luminophoric medium. In some embodiments, only a single second narrow-spectrum luminescent material is included in the recipient luminophoric medium. A peak emission of the first luminescent material may exceeds a peak emission of each second luminescent material. Moreover, a CRI value of the combined light emitted by the semiconductor light emitting device is at least 60 and less than 80 and, in some embodiments, is between 69 and 75.

In some embodiments, the emission power of each second luminescent material may be less than the emission power of the first luminescent material at all wavelengths. In other words, the curve(s) representing the emission spectra for each second luminescent material may be completely underneath the curve representing the emission spectra for the first luminescent material when the emission spectra of the first and second luminescent materials are plotted on the same graph. In some embodiments, a single second narrow-spectrum luminescent material may be included in the recipient luminophoric medium, and the peak wavelength of this second narrow-spectrum luminescent material is between 60-70 nanometers greater than the peak wavelength of the first luminescent material.

In other embodiments of the present invention, semiconductor light emitting devices are provided that include one or more LEDs and a recipient luminophoric medium that includes a first narrow-spectrum luminescent material that emits light having a peak wavelength in the green or yellow color ranges, and a second narrow-spectrum luminescent material that emits light having a peak wavelength in the orange or red color ranges. In some embodiments, the first luminescent material and the second luminescent material, along with any additional luminescent materials that are included in the recipient luminophoric medium that have a full-width half maximum spectral width of less than 70 nanometers, generate at least 80% of the light emitted by the recipient luminophoric medium. In other embodiments, the first luminescent material and the second luminescent material, along with any additional luminescent materials that are included in the recipient luminophoric medium that have a full-width half maximum spectral width of less than 70 nanometers, generate at least 90% of the light emitted by the recipient luminophoric medium. A CRI value of the combined light emitted by the semiconductor light emitting device is at least 60 and less than 80 and, in some embodiments, is between 69 and 75.

According to still further embodiments of the present invention, semiconductor light emitting devices are provided that include one or more LEDs and a recipient luminophoric medium that includes a first very narrow emission luminescent material that emits light having a peak wavelength in the green or yellow color ranges, and a second very narrow emission luminescent material that emits light having peak wavelengths in the orange or red color ranges. The first and second luminescent materials are the only luminescent materials included in the recipient luminophoric medium. A peak emission power of the LED is less than a peak emission power of the first luminescent material and is also less than a peak emission power of the second luminescent material. A CRI value of the light emitted by the semiconductor light emitting device is at least 60 and less than 80 and, in some embodiments, is between 69 and 75.

Narrow-spectrum luminescent materials have been suggested for use in white-light emitting semiconductor light emitting devices. However, the primary use of narrow-spectrum luminescent materials has been in high-CRI devices such as devices having CRI values of 90 or more. Narrow-spectrum luminescent materials may advantageously fill in gaps between peaks in the power spectral density to increase the CRI performance of a semiconductor light emitting device, or be used to provide emission in deeper red spectral regions (e.g., above 630 nm) to improve the CRI of R9 performance of the device. The use of narrow-spectrum luminescent materials has not been suggested for low-CRI applications, let alone the use of narrow-spectrum luminescent materials as the only luminescent materials included in the device or as the luminescent materials that provide the vast bulk of the emission by the recipient luminophoric medium.

As described in detail below, for low-CRI applications such as applications requiring a CRI in the range of 60-80 (or, in some cases, the more specific range of 69-75), simple semiconductor light emitting devices may be provided that may have as few as two luminescent materials in the recipient luminophoric mediums thereof that can meet the CRI requirements while providing enhanced brightness as compared to conventional solutions. These semiconductor light emitting devices employ a first luminescent material that emits light having a peak wavelength in the green or yellow color ranges (typically the green color range) and a second narrow-spectrum luminescent material that emits light in the orange or red color ranges. The second narrow-spectrum luminescent material may have a peak wavelength of less than 625 nm and, more in some embodiments may have a peak wavelength in the 595-612 nm range. In some embodiments, the first narrow-spectrum luminescent material may have a peak wavelength that is 60-70 nm less than the peak wavelength of the second narrow-spectrum luminescent material. Amounts of the first and second luminescent materials may be selected to achieve a desired color point for the light emission and to achieve a CRI value for the light emitted by the semiconductor light emitting device that meets a pre-specified minimum threshold such as, for example, a CRI of 70.

Example embodiments of the present invention will now be discussed with reference to FIGS. 4A-11C.

FIGS. 4A-4D are graphs illustrating how narrow-spectrum luminescent materials may provide increased luminous efficacy, which may also be referred to herein as the luminous efficacy of radiation or "LER" performance. LER may be measured in lumens/Watt. As described above, lumens is a measure of the brightness of a light source that takes into account the sensitivity of the human eye to light of different colors. Thus, lumens is a measure of light output that reflects how humans will perceive the brightness of a light source. LER is a measure of the lumens output by the light source divided by the physical radiative power (Watts) released by the light source, and hence is a measure of how bright a light source will appear to a human observer normalized by the amount of energy released by the light source (i.e. some sources with higher LER will appear brighter to humans, in spite of releasing the same physical energy as other sources with lower LER).

A light emitting device having the power spectral density shown in FIG. 4A with a peak wavelength of 550 and a FWHM spectral width of 15 nm has an LER value of 669. As shown in FIG. 4B, if the FWHM spectral width is expanded to 35 nm, the LER value is reduced to 625. As shown in FIG. 4C, if the FWHM spectral width is expanded further to 60 nm, the LER value is further reduced to 550. Finally, as shown in FIG. 4D, if the FWHM spectral width is expanded to 110 nm the LER value is reduced to 426. This effect results because narrower emission spectra have emissions that are closer to the pure colors locus, and hence have more lumen content for the same input energy, resulting in the improved LER performance illustrated in FIGS. 4A-4D.

Figure 5A:
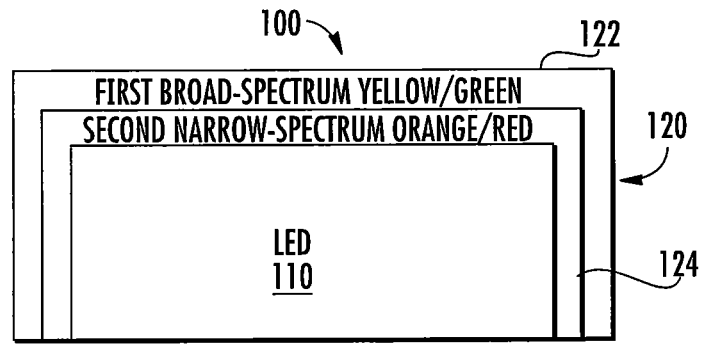
FIGS. 5A-5C are schematic cross-sectional views of high-brightness, low-CRI semiconductor light emitting devices according to certain embodiments of the present invention.
Figure 5B:
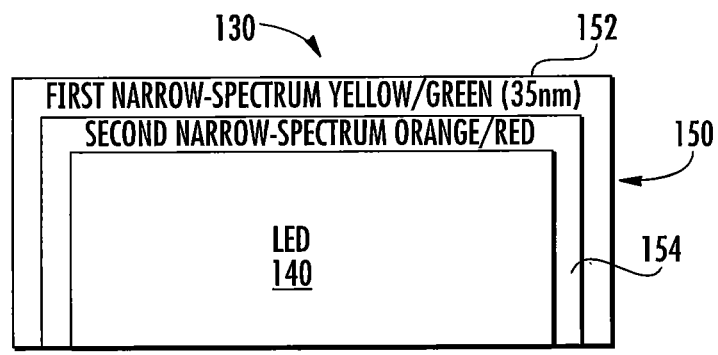
Figure 5C:
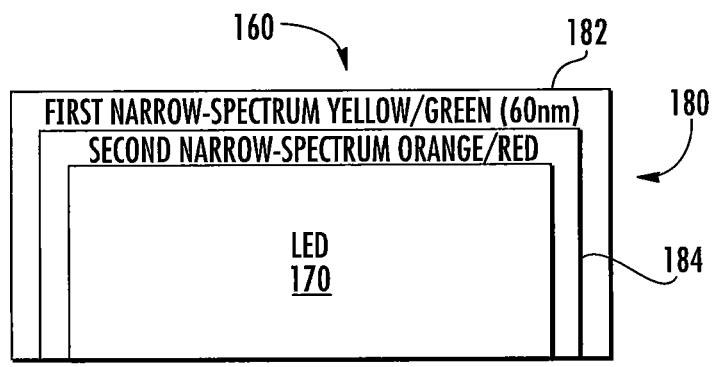

FIGS. 5A-5C are schematic cross-sectional diagrams illustrating example semiconductor light emitting devices according to embodiments of the present invention that include recipient luminophoric mediums having one or more narrow-spectrum luminescent materials. The white light emitting semiconductor light emitting devices of FIGS. 5A-5C are low-CRI devices that may exhibit increased lumens/Watt output as compared to state-of-the-art conventional devices while maintaining other performance parameters. While FIGS. 5A-5C illustrate the phosphors being separated into different layers, it will be appreciated that they may alternatively be mixed together in a single layer.

As shown in FIG. 5A, a semiconductor light emitting device 100 includes an LED 110 and a recipient luminophoric medium 120. The LED 110 may comprise, for example, a blue LED 110 that emits light having a peak wavelength between, for example, 440 nanometers and 475 nanometers. In some embodiments, the blue LED 110 may emit light having a peak wavelength between 445 and 460 nanometers. Violet, ultraviolet or other LEDs could be used in other embodiments.

The recipient luminophoric medium 120 is arranged to receive light emitted by the LED 110 including, for example, light emitted from the sides and top of the LED 110. The recipient luminophoric medium 120 may include a plurality of luminescent materials that are suspended, for example, in one or more binder layers. In the depicted embodiment, the recipient luminophoric medium 120 includes two luminescent materials, namely (1) a first broad-spectrum luminescent material 122 that down-converts radiation emitted by the LED 110 to radiation having a peak wavelength in the yellow color range or the green color range and (2) a second narrow-spectrum luminescent material 124 that down-converts radiation emitted by the LED 110 to radiation having a peak wavelength in the orange color range or the red color range. The first broad-spectrum luminescent material may comprise, for example, a LuAG:Ce phosphor having a peak wavelength between, for example, 530 and 550 nanometers or a YAG:Ce phosphor having a peak wavelength between, for example, 535 and 560 nanometers, although other luminescent, materials and/or other peak wavelengths may be used.

In the depicted embodiment, the first and second luminescent materials are included in separate layers 122, 124. The first layer 122 that is farthest from the LED 110 includes the first broad-spectrum green or yellow luminescent material while the second layer 124 that is closest to the LED 110 includes the second narrow-spectrum orange or red luminescent material. In other embodiments the luminescent materials may be mixed together in a single layer. It will also be appreciated that the order of the layers may be changed.

Referring next to FIG. 5B, a semiconductor light emitting device 130 includes an LED 140 and a recipient luminophoric medium 150. The LED 140 may be the same as the LED 110 described above with reference to FIG. 5A, and hence further description thereof will be omitted.

The recipient luminophoric medium 150 is arranged to receive light emitted by the LED 140 including, for example, light emitted from the sides and top of the LED 140. The recipient luminophoric medium 150 may include a plurality of luminescent materials that are suspended, for example, in one or more binder layers. In the depicted embodiment, the recipient luminophoric medium 150 includes two luminescent materials, namely (1) a first narrow-spectrum luminescent material 152 that down-converts radiation emitted by the LED 110 to radiation having a peak wavelength in the yellow color range or the green color range and (2) a second narrow-spectrum luminescent material 154 that down-converts radiation emitted by the LED 140 to radiation having a peak wavelength in the orange color range or the red color range. The first narrow-spectrum luminescent material 152 may comprise, for example, a phosphor or other luminescent material having a peak wavelength between, for example, 530-550 nanometers (or 530-545 nm in other embodiments, and 535-545 nm in still other embodiments). The FWHM spectral width of the emission spectrum of the first narrow-spectrum luminescent material 152 may be, for example, less than 45 nanometers in some embodiments. In other embodiments, the FWHM spectral width of the emission spectrum of the first narrow-spectrum luminescent material 152 may be, for example, less than 35 nanometers.

In the depicted embodiment, the first and second luminescent materials are included in separate layers 152, 154. The first layer 152 that is farthest from the LED 140 includes the first narrow-spectrum green or yellow luminescent material while the second layer 154 that is closest to the LED 140 includes the second narrow-spectrum orange or red luminescent material. In other embodiments the luminescent materials may be mixed together in a single layer. It will also be appreciated that the order of the layers may be changed.

Referring next to FIG. 5C, a semiconductor light emitting device 160 includes an LED 170 and a recipient luminophoric medium 180. The LED 170 may be the same as the LED 110 described above with reference to FIG. 5A, and hence further description thereof will be omitted.

The recipient luminophoric medium 180 is arranged to receive light emitted by the LED 170. The recipient luminophoric medium 180 may include a plurality of luminescent materials that are suspended, for example, in one or more binder layers. In the depicted embodiment, the recipient luminophoric medium 180 includes two luminescent materials, namely (1) a first narrow-spectrum luminescent material 182 that down-converts radiation emitted by the LED 170 to radiation having a peak wavelength in the yellow color range or the green color range and (2) a second narrow-spectrum luminescent material 184 that down-converts radiation emitted by the LED 170 to radiation having a peak wavelength in the orange color range or the red color range. The recipient luminophoric medium 180 may be identical to the recipient luminophoric medium 150 discussed above with reference to FIG. 5B except that the FWHM spectral width of the first narrow-spectrum luminescent material 182 may be larger than the FWHM spectral width of the first narrow-spectrum luminescent material 152. For example, the FWHM spectral width of the emission spectrum of the first narrow-spectrum luminescent material 182 may be between 45-70 nanometers in some embodiments. In other embodiments, the FWHM spectral width of the emission spectrum of the first narrow-spectrum luminescent material 182 may be, for example, between 50-65 nanometers.

It will be appreciated that FIGS. 5A-5C are not intended to be limiting. For example, while the recipient luminophoric mediums depicted in FIGS. 5A-5C are shown as comprising multi-layer recipient luminophoric mediums with each different phosphor included in its own layer, it will be appreciated that single layer recipient luminophoric mediums may be used instead in which all of the luminescent materials are mixed within the same layer or coating.

It will also be appreciated that other changes may be made to the semiconductor light emitting devices 100, 130, 160 of FIGS. 5A-5C. For example, in other embodiments, one or more of the layers of the recipient luminophoric mediums 120, 150, 180 may not extend to surround side surfaces of the LEDs 110, 140, 170, and may not even cover an entire top (or other) surface of the LEDs 110, 140, 170. As another example, the recipient luminophoric mediums 120, 150, 180 need not be coated directly on the respective LEDs 110, 140, 170, but instead need only be arranged to receive light emitted by their respective LEDs 110, 140, 170. Additional broad-spectrum luminescent material(s) and/or narrow-spectrum luminescent material(s) may also be included in the recipient luminophoric mediums 120, 150, 180, as will be discussed in more detail below.

Figure 6A:
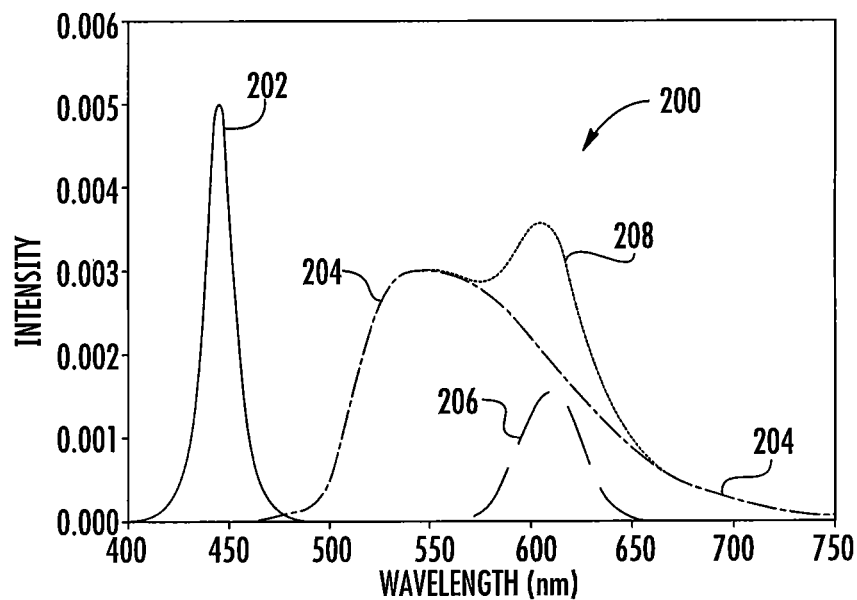
FIGS. 6A-6C are graphs illustrating the simulated emission spectra of the semiconductor light emitting devices of FIGS. 5A-5C, respectively.
Figure 6B:
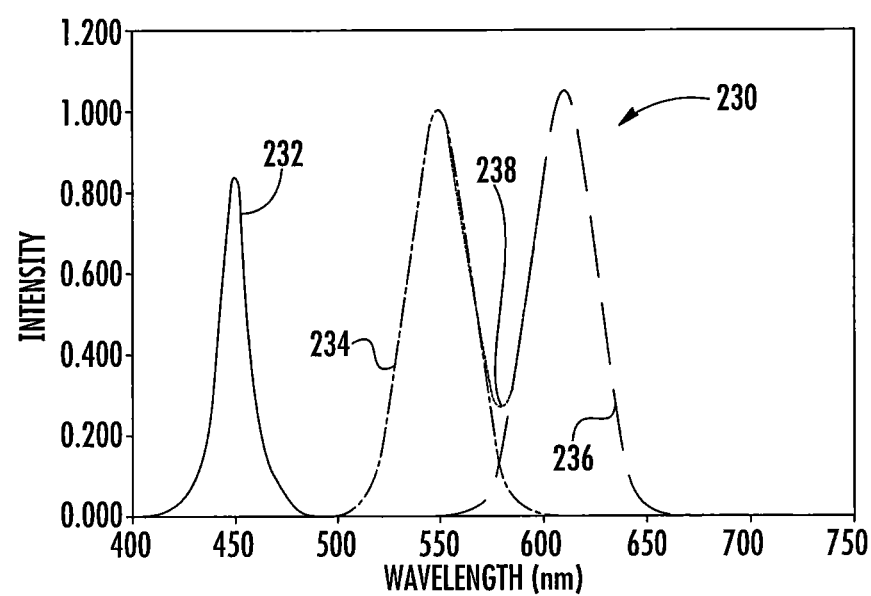
Figure 6C:
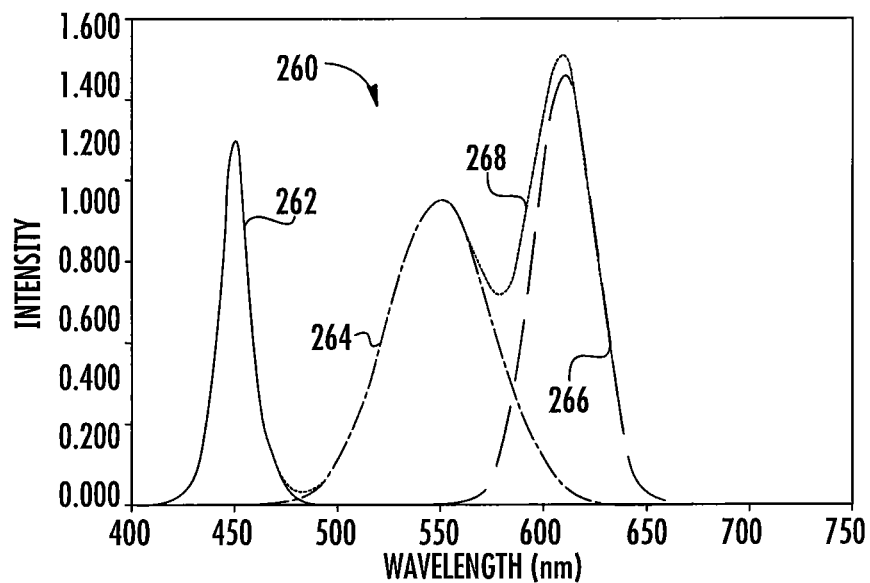

FIGS. 6A-6C are graphs of the emission spectrum 200, 230, 260 of the semiconductor light emitting devices 100, 130, 160 of FIGS. 5A-5C, respectively.

FIG. 6A illustrates the simulated emission spectrum 200 for the semiconductor light emitting device 100 that includes the recipient luminophoric medium 120 having a first broad-spectrum luminescent material 122 and a second narrow-spectrum luminescent material 124 that is discussed above with reference to FIG. 5A. The emission spectrum 200 is for an embodiment in which the first broad-spectrum luminescent material 122 comprises a YAG:Ce phosphor having a peak wavelength of about 555 nm and a FWHM spectral width of about 115 nm, and the second narrow-spectrum luminescent material 124 comprises a very narrow emission red luminescent material having a peak wavelength of 610 nm and a FWHM width of 35 nm. In FIG. 6A, the curves 202, 204, 206 represent the contributions to the emission spectrum of the emissions of the blue LED, the YAG:Ce phosphor and the red emitter, respectively. The curve 208 represents the combined emission spectrum for the semiconductor light emitting device 100.

As shown in FIG. 6A, the intensity of the emission from the blue LED 110 may substantially exceed the emissions from the YAG:Ce phosphor 122 and the red very narrow emission luminescent material 124. In particular, the intensity of the emission from the blue LED 110 may be at least 50% greater than the intensity of the emission from the YAG:Ce phosphor 122, and the intensity of the emission from the blue LED 110 may also be at least 50% greater than the intensity of the emission from the very narrow red emitter 124. In other embodiments, the intensity of the emission from the blue LED 110 may also be at least 150% the intensity of the emission from the very narrow red emitter 124. In still other embodiments, the intensity of the emission from the blue LED 110 may also be at least twice the intensity of the emission from the very narrow red emitter 124.

When designed to emit light having the same color point as the conventional state-of-the-art semiconductor light emitting device 50 that is described above with reference to FIGS. 3A-3B, the semiconductor light emitting device 100 may achieve luminous efficacy values that are about 5% higher than the conventional state-of-the-art semiconductor light emitting device 50 while achieving the same or better CRI performance. This result is non-intuitive as replacing the broad-spectrum red luminescent material included in the conventional state-of-the-art semiconductor light emitting device with a 35 nm very narrow red emitter would be expected to result in a reduction in CRI performance since the red emitter 124 has contributions at far fewer wavelengths.

One reason that CRI performance may be maintained may have to do with the manner in which CRI is calculated. The calculation of CRI is based on eight color samples that are primarily pastel shades, as opposed to saturated colors. Moreover, only a few of the color samples used to compute CRI have significant red content (namely sample R1, which is a pink shade, and sample R8, which is a purple shade), and these samples are not saturated color samples so that high CRI scores may be achieved even without significant red content in a light source.

Figure 7:
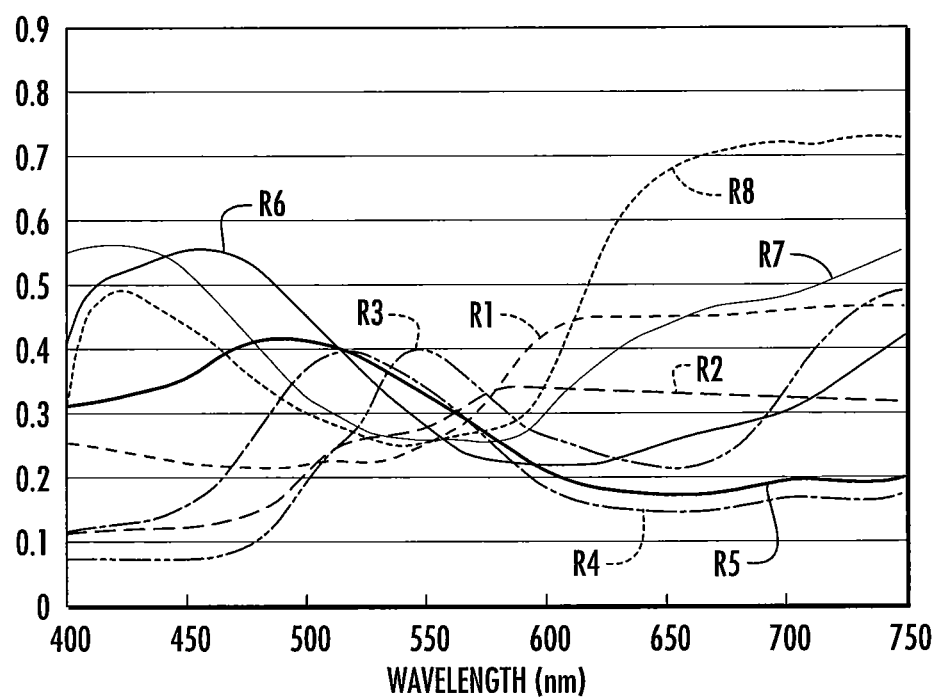
FIG. 7 is a graph illustrating the reflectance spectra for the R1-R8 color samples used to calculate CRI when illuminated by a reference light source.

This can be seen in FIG. 7, which shows the reflectance spectra (i.e., reflected power as a function of wavelength) for the R1-R8 color samples that are used to calculate CRI when those color samples are illuminated by a reference light source. As can be seen in FIG. 7, color samples R1-R8 include mixes of many different colors, as shown by the fact that samples R1-R8 have significant contribution across a broad portion of the visible light spectrum.

The semiconductor light emitting devices according to embodiments of the present invention may exploit the reduced effect that red emissions—and particularly red emissions above about 620 nm—have on CRI, by "packing" the red contribution in a narrow wavelength range in the, for example, 590-625 nm range. This may be as effective in terms of CRI performance as a much broader red emission, and may increase the LER performance of the device by concentrating the red emission at lower wavelengths that are farther up the eye response curve of FIG. 2.

As can further be seen in FIG. 6A, in some embodiments, the peak intensity of the emission of the narrow-spectrum orange or red luminescent material may be less than the intensity of the emission of the broad-spectrum yellow/green light emitting luminescent material. This is shown in FIG. 6A by the fact that curve 206 corresponding to the emission of the narrow-spectrum red luminescent material is underneath curve 204 corresponding to the broad-spectrum yellow/green light emitting luminescent material at all wavelengths.

As discussed above, the semiconductor light emitting device 100 includes a recipient luminophoric medium that only includes two luminescent materials, namely a YAG:Ce phosphor 122 and a very narrow red emitter 124. As discussed above, the semiconductor light emitting device 100 may achieve luminous efficacy values that are about 5% higher than the conventional state-of-the-art semiconductor light emitting device while achieving the same or better CRI performance. It will be appreciated that in other embodiments additional luminescent materials may be added to the recipient luminophoric medium 120 while still achieving enhanced performance. For example, in other embodiments, the amount of the very narrow red emitter 124 that is included in the recipient luminophoric medium 120 may be reduced and one or more additional narrow-spectrum orange or red light emitting luminescent materials may be added to the recipient luminophoric medium 120. This may potentially further improve the CRI of the semiconductor light emitting device 100 since it will spread out the contributions in the orange and red color ranges. The total emission from the narrow-spectrum orange and red light emitting luminescent materials may be similar to the total emission for the very narrow red emitter shown in FIG. 6A in some embodiments. If the addition of one or more additional narrow-spectrum orange or red light emitting luminescent materials improves the CRI above a desired value (e.g., above 70), then the amount of YAG:Ce phosphor may be increased relative to the total amount of narrow-spectrum orange or red light emitting luminescent materials until the CRI is reduced to the target value. This may further improve the luminous efficacy performance of the semiconductor light emitting device as the YAG:Ce phosphor is a high efficiency phosphor with a peak emission at or near the wavelength where the human eye best perceives light.

It will likewise be appreciated that additional broad-spectrum luminescent materials may be added to the recipient luminophoric medium 120. For example, a LuAG:Ce green phosphor or a broad-spectrum orange or red light emitting luminescent material could be added to the recipient luminophoric medium 120. However, as discussed above, the net effect of adding a broad-spectrum orange or red light emitting phosphor may be to decrease the luminous efficacy performance of the semiconductor light emitting device. This occurs primarily because of long emission tails for these broad-spectrum phosphors extend beyond, for example, 650 nm, where the eye sensitivity becomes extremely low, so those photons are basically lost in terms of lumen conversion. Accordingly, in some embodiments of the present invention, the contribution of any broad-spectrum orange or red light emitting luminescent materials to emissions at wavelengths above 590 nm may be less than 20% the total emission of all narrow-spectrum and broad-spectrum orange or red light emitting luminescent materials at wavelengths above 590 nm. In other embodiments, the contribution of any broad-spectrum orange or red light emitting luminescent materials to emissions at wavelengths above 590 nm may be less than 15%, less than 10% or less than 5% the total emission of all narrow-spectrum and broad-spectrum orange or red light emitting luminescent materials at wavelengths above 590 nm. In other words, relatively small amounts of broad-spectrum orange or red luminescent materials may be used to replace a portion of the one or more narrow-spectrum orange or red luminescent materials, but the primary contribution in the orange and red color ranges comes from the "tail" of the broad-spectrum yellow or green luminescent material(s) that extends above 585 nm and from the one or more narrow-spectrum orange or red light emitting luminescent materials.

FIG. 6B illustrates the simulated emission spectrum 230 for the semiconductor light emitting device 130 of FIG. 5B that includes a recipient luminophoric medium 150 having a first narrow-spectrum yellow or green luminescent material 152 and a second narrow-spectrum orange or red luminescent material 154, where both luminescent materials are very narrow emission luminescent materials having a FWHM spectral width of less than 40 nm. Here, the first narrow-spectrum luminescent material 152 has a peak wavelength of 550 nm and a FWHM spectral width of 35 nm, and the second narrow-spectrum luminescent material 154 has a peak wavelength of 610 nm and a FWHM spectral width of 35 nm. In FIG. 6B, the curves 232, 234, 236 represent the contributions to the emission spectrum of the emissions of the blue LED 140, the first narrow-spectrum yellow or green luminescent material 152 and the second narrow-spectrum orange or red luminescent material 154, respectively. The curve 238 represents the combined emission spectrum for the semiconductor light emitting device 130.

As shown in FIG. 6B, the peak intensity of the emission from the blue LED 140 may be less than the peak intensity of the respective emissions from the first narrow-spectrum yellow or green luminescent material 152 and the second narrow-spectrum orange or red very narrow emission luminescent material 154. This is the opposite of the case illustrated in FIG. 6A above. Since the first narrow-spectrum yellow or green luminescent material 152 has a much narrower FWHM spectral width as compared to the YAG:Ce phosphor included in the recipient luminophoric medium 120 of semiconductor light emitting device 100, it may be necessary to significantly increase the peak intensity of the emission from the first narrow-spectrum yellow or green luminescent material 152 in order to have sufficient contributions in the yellow/green wavelengths in order to achieve a target CRI value. Likewise, since, unlike the YAG:Ce phosphor, the first narrow-spectrum yellow or green luminescent material 152 has almost no contribution in the orange and red color ranges, it also may be necessary to significantly increase the peak intensity of the emission from the second narrow-spectrum orange or red luminescent material 154 in order to have sufficient contributions in the orange/red wavelengths in order to achieve the target CRI value. As shown in FIG. 6B, in some embodiments, the peak emission intensity of the second narrow-spectrum orange or red luminescent material 154 may exceed the peak emission intensity of the first narrow-spectrum yellow or green luminescent material 152, and both the first narrow-spectrum luminescent material 152 and the and second narrow-spectrum luminescent material 154 have peak emissions when excited by the light from the LED 140 that exceeds the light emission of the LED 140 that passes through the recipient luminophoric medium 150.

When designed to emit light having the same color point as the conventional state-of-the-art semiconductor light emitting device 50 that is described above with reference to FIGS. 3A-3B, the semiconductor light emitting device 130 may achieve LER values that are about 10-15% higher than the conventional state-of-the-art semiconductor light emitting device while achieving the same or better CRI performance. At the particular color point associated with the emission spectrum of FIG. 6B, the semiconductor light emitting device 130 may achieve a luminous efficacy value that is about 11% higher than the luminous efficacy of the conventional state-of-the-art semiconductor light emitting device 50 while still achieving the same or better CRI performance. This result again is non-intuitive as replacing the two broad-spectrum luminescent materials included in the conventional state-of-the-art semiconductor light emitting device 50 with two narrow-spectrum luminescent materials would be expected to result in a reduction in CRI performance.

A reason that this enhanced performance may be achieved is that the narrow-spectrum green luminescent material concentrates the emission at the wavelengths where the human eye best perceives light, namely at wavelengths near 555 nm. The strong emission in this wavelength range may increase the luminous efficacy performance of the device. The reduced contribution at other wavelengths in the cyan, green, yellow, orange and red wavelength ranges as compared to the YAG:Ce phosphor has the effect of reducing the CRI performance of the device. However, by increasing the amount of red luminescent material 154, it is possible to "recover" this reduction in CRI and still provide a low-CRI semiconductor light emitting device that meets a target CRI performance level (e.g., above 70 CRI). As discussed above, this approach may unexpectedly provide overall improved performance when the target CRI levels are in a certain range such as, for example, a CRI range of 60-80 or an even tighter CRI range of 65-78, or an even tighter CRI range of 69-75.

As with the semiconductor light emitting device 100 discussed above, the recipient luminophoric medium 150 for the semiconductor light emitting device 130 may be modified to include additional luminescent materials while still achieving enhanced performance. For example, in other embodiments, the amount of the red very narrow emission luminescent material 154 that is included in the recipient luminophoric medium 150 may be reduced and one or more additional narrow-spectrum orange or red light emitting luminescent materials may be added to the recipient luminophoric medium 150. This may potentially further improve the CRI of the semiconductor light emitting device 130. The total emission from the multiple narrow-spectrum orange and red light emitting luminescent materials may be similar to the total emission for the single red emitter shown in FIG. 6B in some embodiments. If the addition of one or more additional narrow-spectrum orange or red light emitting luminescent materials improves the CRI above a desired value (e.g., above 70), then the amount of first narrow-spectrum luminescent material 152 may be increased relative to the total amount of narrow-spectrum orange or red light emitting luminescent materials until the CRI is reduced to the target value. This may potentially further improve the luminous efficacy performance of the semiconductor light emitting device. Likewise, a small amount of another narrow spectrum luminescent material having a peak wavelength outside of the orange and red color ranges may be added to the recipient luminophoric medium 150. As one example, a small amount of a narrow-spectrum or very narrow emission luminescent material that emits light having a peak wavelength in the cyan color range could be added. The additional contribution in the cyan color range may improve CRI performance, as FIG. 6B shows that the semiconductor light emitting device 150 has almost no emission in this color range. The improvement in CRI performance may allow for a reduction in the amount of the second narrow-spectrum red luminescent material 154 used and perhaps a small increase in the amount of the first narrow-spectrum luminescent material 152. This may potentially provide further enhancement in luminous efficacy performance while meeting a desired level of CRI performance at a selected color point.

Additionally, as discussed above with respect to the semiconductor light emitting device 100, additional broad-spectrum luminescent materials may be added to the recipient luminophoric medium 150 of the semiconductor light emitting device 130. For example, a LuAG:Ce phosphor or a broad-spectrum orange or red light emitting phosphor could be added. However, since the net effect of adding a broad-spectrum orange or red light emitting phosphor may be to decrease the luminous efficacy performance of the semiconductor light emitting device, the first and second narrow-spectrum luminescent materials 152, 154 along with any additional narrow-spectrum luminescent materials that are included in the recipient luminophoric medium 150 may generate at least 80% of the light emitted by the recipient luminophoric medium 150.

FIG. 6C illustrates the simulated emission spectra 260 for the semiconductor light emitting device 160 that includes a recipient luminophoric medium 180 having a first narrow-spectrum yellow or green luminescent material 182 and a second narrow-spectrum orange or red luminescent material 184, where the first narrow-spectrum yellow or green luminescent material 182 has a peak wavelength of 550 nm and a FWHM spectral width of 60 nm, and the second narrow-spectrum orange or red luminescent material 184 has a peak wavelength of 610 nm and a FWHM spectral width of 35 nm. In FIG. 6C, the curves 262, 264, 266 represent the contributions to the emission spectrum of the emissions of the blue LED 170, the first narrow-spectrum yellow or green luminescent material 182 and the second narrow-spectrum orange or red luminescent material 184, respectively. The curve 268 represents the combined emission spectrum for the semiconductor light emitting device 160.

As shown in FIG. 6C, in some embodiments, the peak intensity of the emission from the blue LED 170 may exceed the peak intensity of the emission from the first narrow-spectrum yellow or green luminescent material 182 and may be less the peak intensity of the emission from the second narrow-spectrum orange or red luminescent material 184.

When designed to emit light having the same color point as the conventional state-of-the-art semiconductor light emitting device 50 that is described above with reference to FIGS. 3A-3B, the semiconductor light emitting device 160 may achieve luminous efficacy values that are about 10-15% higher than the conventional state-of-the-art semiconductor light emitting device 50 while achieving the same or better CRI performance. This enhanced performance may be achieved for reasons similar to those discussed above with reference to FIG. 6B for the semiconductor light emitting device 130.

As with the semiconductor light emitting devices 100, 130 discussed above, the recipient luminophoric medium 180 for the semiconductor light emitting device 160 may be modified to include additional luminescent materials while still achieving enhanced luminous efficacy performance. For example, in other embodiments, the amount of the red very narrow emission luminescent material 184 that is included in the recipient luminophoric medium 180 may be reduced and one or more additional narrow-spectrum orange or red light emitting luminescent materials may be added to the recipient luminophoric medium 180. Likewise, another cyan, green or yellow narrow spectrum luminescent material may be added to the recipient luminophoric medium 180.

Additionally, as discussed above with respect to the semiconductor light emitting device 100, additional broad-spectrum luminescent materials may be added to the recipient luminophoric medium 180 of the semiconductor light emitting device 160. For example, a LuAG:Ce phosphor or a broad-spectrum orange or red light emitting phosphor could be added. Since the net effect of adding a broad-spectrum orange or red light emitting phosphor may be to decrease the luminous efficacy performance of the semiconductor light emitting device, the first and second narrow-spectrum luminescent materials 182, 184 along with any additional narrow-spectrum luminescent materials that are included in the recipient luminophoric medium 180 may generate at least 80% of the light emitted by the recipient luminophoric medium 180.

Figure 8:
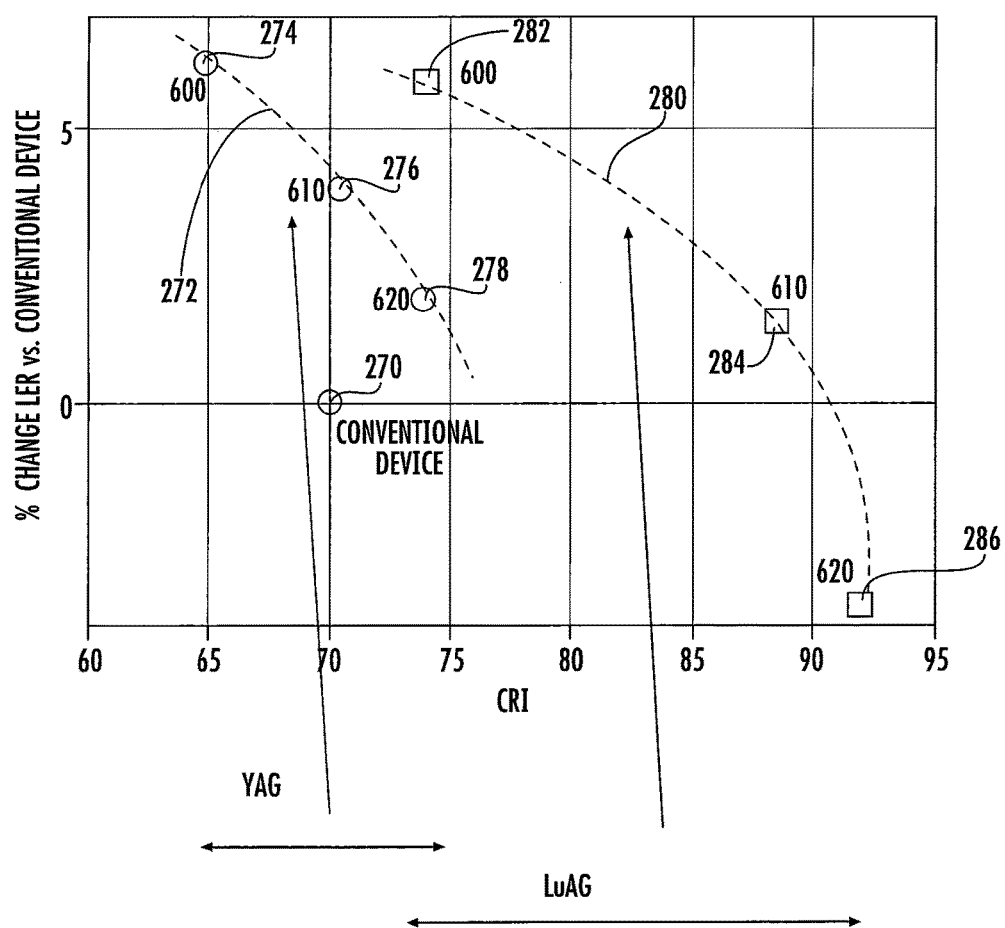
FIG. 8 is a graph illustrating the luminous efficacy gains of various semiconductor light emitting devices according to embodiments of the present invention as compared to a conventional, state-of-the-art, high-brightness, low-CRI semiconductor light emitting device (labelled "POR") that is used at a point of reference.

FIG. 8 is graph illustrating the increase in LER performance as compared to the conventional high-brightness, low-CRI state-of-the-art light emitting device 50 discussed above with reference to FIGS. 3A-3B as a function of CRI. Referring to FIG. 8, the point labelled 270 corresponds to the conventional state-of-the-art light emitting device 50. As can be seen, this device has a CRI of 70 and a relative/reference luminous efficacy value of "O."

Curve 272 in FIG. 8 is a bivariate fit of three data points 274, 276, 278 corresponding to three light emitting devices according to embodiments of the present invention. The three data points 274, 276, 278 defining curve 272 correspond to embodiments of the semiconductor light emitting device 100 in which the first broad-spectrum luminescent material comprises a YAG:Ce phosphor and the second narrow-spectrum luminescent material comprises a simulated red very narrow emission luminescent material. The three data points 274, 276, 278 in curve 272 correspond to three different red emitters having peak wavelengths of 600 nm, 610 nm and 620 nm, respectively.

Curve 280 in FIG. 8 is a bivariate fit of three data points 282, 284, 286 corresponding to three additional light emitting devices according to embodiments of the present invention. The three data points 282, 284, 286 defining curve 280 correspond to embodiments of the semiconductor light emitting device 100 in which the first broad-spectrum luminescent material comprises a LuAG:Ce phosphor and the second narrow-spectrum luminescent material comprises a simulated red very narrow emission luminescent material. The three data points 282, 284, 286 in curve 280 correspond to three different red emitters having peak wavelengths of 600 nm, 610 nm and 620 nm, respectively.

As shown in FIG. 8, the semiconductor light emitting devices corresponding to the data points 274, 276, 278 all provide enhanced LER performance as compared to the conventional semiconductor light emitting device 50 of FIG. 3A. The lower the peak wavelength of the second narrow-spectrum luminescent material, the greater the improvement in luminous efficacy performance, but the lower the CRI value. As can be seen in FIG. 8, the light emitting device corresponding to point 276 exhibits luminous efficacy performance about 4% better than the conventional semiconductor light emitting device 50 while providing a very slight increase in CRI performance. The light emitting device corresponding to point 278 exhibits luminous efficacy performance about 2% better than the conventional semiconductor light emitting device 50 while providing an improvement of about 4 in CRI performance.

The data points of curve 280 show a wider variation in luminous efficacy and CRI performance. Point 286 provides excellent CRI performance (CRI of about 92), but exhibits luminous efficacy performance that is about 4% worse than the conventional semiconductor light emitting device 50. Point 282 illustrates a light emitting device according to embodiments of the present invention that exhibits an improvement in luminous efficacy performance of about 6% as well as an improvement in CRI performance of about 4. Thus, FIG. 8 illustrates how the semiconductor light emitting devices according to embodiments of the present invention may provide improved performance in high-brightness, low-CRI applications as compared to the conventional semiconductor light emitting device 50.

Figures 9A, 9B:
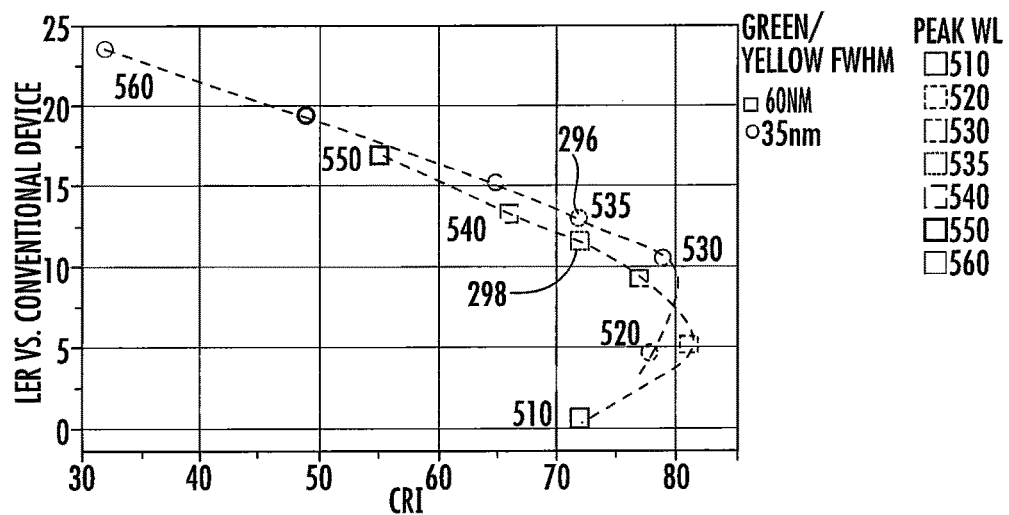
FIGS. 9A-9B are graphs illustrating the luminous efficacy of additional semiconductor light emitting devices according to embodiments of the present invention as compared to the conventional, state-of-the-art, high-brightness, low-CRI semiconductor light emitting device.

FIG. 9A is a graph illustrating how the luminous efficacy and CRI performance vary as a function of the peak wavelength of the green/yellow narrow-spectrum luminescent material and as a function of the FWHM spectral width of the green/yellow narrow-spectrum luminescent material. The graph of FIG. 9A corresponds to a semiconductor light emitting device that has a luminophoric medium that includes a green/yellow narrow-spectrum luminescent material having a variable peak wavelength and FWHM spectral width and a red narrow-spectrum luminescent material that has a peak wavelength of 600 nm and a FWHM spectral width of 35 nm. Each semiconductor light emitting device was designed to have a correlated color temperature of about 4000 K.

As shown in FIG. 9A, improved luminous efficacy performance is obtained as the peak wavelength of the green/yellow narrow-spectrum luminescent material is increased (at least up to peak wavelengths of 560 nm), but once the peak wavelength is increased to about 530 nm, the CRI performance starts to decrease. For applications where a minimum CRI value of 70 is required, a variety of semiconductor light emitting devices according to embodiments of the present invention may meet the minimum CRI performance while providing improved luminous efficacy performance as compared to the conventional low-CRI semiconductor light emitting device 50. In the example of FIG. 9A, the best simulated performance is achieved when the green/yellow narrow-spectrum luminescent material has a peak wavelength of about 535 nm and a FWHM spectral width of 35 nm. This device, corresponding to point 296 in FIG. 9A, exhibits an improvement in luminous efficacy performance of about 13% along with a slight increase in CRI performance. As shown at point 298 in FIG. 9A, similar performance is obtained when the green/yellow narrow-spectrum luminescent material has a peak wavelength of about 535 nm and a FWHM spectral width of 60 nm.

FIG. 9B is another graph illustrating how the luminous efficacy and CRI performance vary as a function of the peak wavelength and FWHM spectral width of the green/yellow narrow-spectrum luminescent material. The graph of FIG. 9B corresponds to a semiconductor light emitting device that has a luminophoric medium that includes a green/yellow narrow-spectrum luminescent material having a variable peak wavelength and FWHM spectral width and a red narrow-spectrum luminescent material that has a peak wavelength of 610 nm and a FWHM spectral width of 35 nm. As in FIG. 9A, each semiconductor light emitting device was designed to have a correlated color temperature of about 4000 K.

As shown in FIG. 9B, improved luminous efficacy performance is obtained as the peak wavelength is increased (at least up to peak wavelengths of 560 nm), but once the peak wavelength is increased to about 530 nm, the CRI performance starts to decrease. For applications where a minimum CRI value of 70 is required, a variety of semiconductor light emitting devices according to embodiments of the present invention may meet the minimum CRI performance while providing improved luminous efficacy performance as compared to the conventional low-CRI semiconductor light emitting device 50. In the example of FIG. 9B, the best simulated performance is achieved when the green/yellow narrow-spectrum luminescent material has a peak wavelength of about 545 nm. For both the green/yellow narrow-spectrum luminescent material having a FWHM spectral width of 35 nm and the green/yellow narrow-spectrum luminescent material having a FWHM spectral width of 60 nm, an improvement in luminous efficacy performance of about 11% was achieved while meeting the minimum CRI value of 70. Thus, the simulations of FIGS. 9A and 9B illustrate the possibility for obtaining improved LER performance for low-CRI applications FIGS. 6A-6C, 8 and 9A-9B illustrate the simulated performance of semiconductor light emitting devices according to embodiments of the present invention, and some of these figures also provide comparative data to the simulated performance of conventional high-brightness, low-CRI state-of-the-art semiconductor light emitting devices. The simulations of both the semiconductor light emitting devices according to embodiments of the present invention and the conventional semiconductor light emitting devices were based on a relatively simplistic model. For example, the model did not consider the effects of the orange/red luminescent materials absorbing some of the light emitted by the yellow/green luminescent materials. Additionally, it was assumed that all of the luminescent materials exhibited quantum yields of 100%, meaning that all of the light (photons) from the associated LED that was absorbed by the luminescent material was down-converted and emitted as light of a different color. In practice, luminescent materials do not exhibit quantum yields of 100%, although many widely used phosphors such as YAG:Ce and LuAG:Ce phosphors exhibit quantum yields of greater than 85% and, in some cases, greater than 90%.

Currently, the quantum yields for many narrow-spectrum luminescent materials may be somewhat less than the quantum yields for various widely used broad-spectrum luminescent materials. By way of example, the quantum yield for red quantum dots having a FWHM spectral width of 35 nm and peak wavelengths in the 600-620 nm range is about 74%, which is lower than the quantum yield of a typical broad-spectrum red luminescent material such as a $(Ca_{1-x}Sr_x)SiAlN_3:Eu^{2+}$ phosphor. The lower quantum yields that may be achieved by various narrow-spectrum luminescent materials may reduce the above-described advantages in terms of luminous efficacy performance of using narrow-spectrum luminescent materials in semiconductor light emitting devices for high-brightness, low-CRI applications. However, quantum yields for luminescent materials historically improve over time as the luminescent materials are refined, and thus it is anticipated that the narrow-spectrum luminescent materials will ultimately achieve quantum yields that are similar to the quantum yields of the broad-spectrum luminescent materials that they will replace when implementing the semiconductor light emitting devices according to embodiments of the present invention.

Figure 10A:
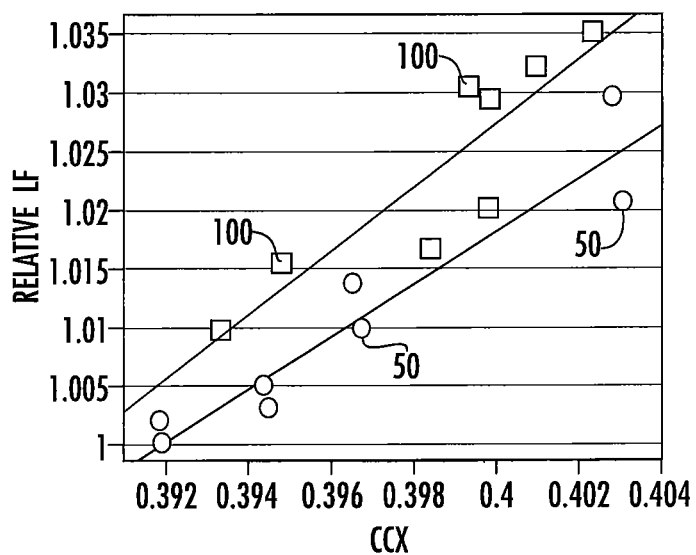
FIG. 10A is a graph comparing the measured luminous efficacy performance of sample conventional state-of-the-art high-brightness, low-CRI semiconductor light emitting devices to semiconductor light emitting devices according to embodiments of the present invention.
Figure 10B:
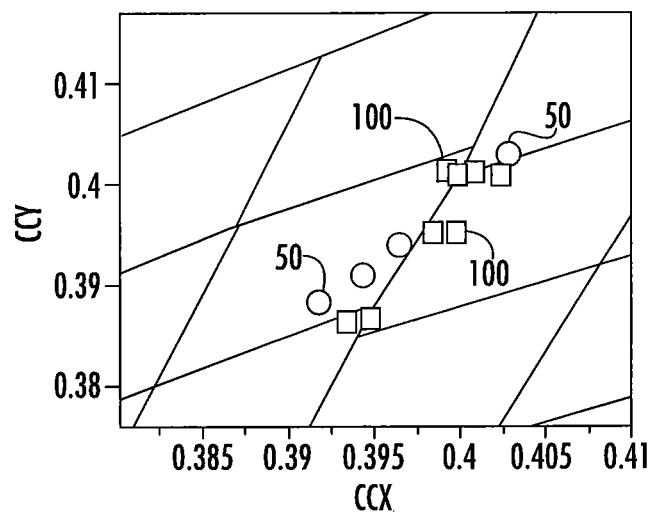
FIG. 10B is a graph that shows that the sample semiconductor light emitting devices of FIG. 10A have comparable color points.
Figure 10C:
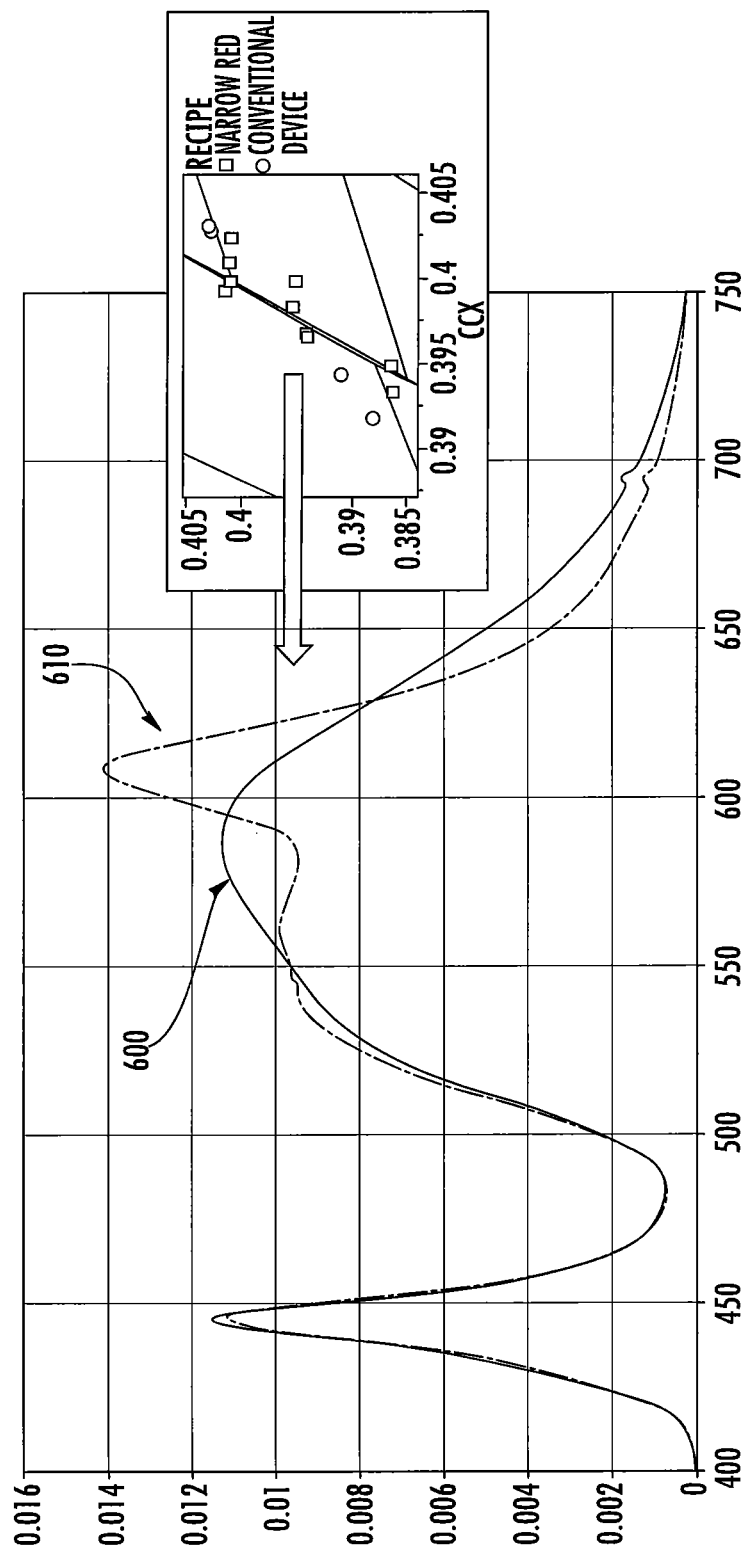
FIG. 10C is a graph comparing the emission spectra of the semiconductor light emitting devices according to embodiments of the present invention used to generate the data in FIGS. 10A-10B to the conventional, high-brightness, low-CRI semiconductor light emitting devices that are used as a basis for comparison in FIGS. 10A and 10B.

FIGS. 10A-10C illustrate the performance of sample semiconductor light emitting devices according to embodiments of the present invention. The data presented in FIGS. 10A-10C is based on a semiconductor light emitting device 100 having the design of FIG. 5A that each include a blue LED having a dominant wavelength of 455 nm and an associated recipient luminophoric medium that includes a YAG:Ce phosphor having a peak wavelength of about 560 nm and a FWHM spectral width of about 115 nm and red quantum dots having a peak wavelength of 609 nm and a FWHM spectral width of 35 nm. The quantum yield of the red quantum dots was approximately 74%.

In particular, FIG. 10A is a graph that compares the luminous flux performance of a series of conventional semiconductor light emitting devices 50 having the emission spectrum shown in FIG. 3B to the luminous flux performance of a series of semiconductor light emitting devices according to embodiments of the present invention have the design of the semiconductor light emitting device 100 that is discussed above with reference to FIGS. 5A and 6A. FIG. 10B is a graph that shows that the conventional semiconductor light emitting devices and the semiconductor light emitting devices 100 that were used to generate the graph of FIG. 10A have comparable color points and hence represent a legitimate comparison. FIG. 10C is a graph comparing the emission spectrum of the semiconductor light emitting devices according to embodiments of the present invention used to generate the data in FIGS. 10A-10B to the conventional, high-brightness, low-CRI semiconductor light emitting devices 50 that are used as a basis for comparison in FIGS. 10A and 10B.

As shown in FIG. 10A, the semiconductor light emitting devices according to embodiments of the present invention exhibited luminous flux values that were approximately 1-2% higher than the luminous flux of the conventional state-of-the-art high brightness, low-CRI semiconductor light emitting devices that they were compared to. Moreover, the CRI of the semiconductor light emitting devices 100 according to embodiments of the present invention was about 74 as compared to a CRI value of 70 for the conventional state-of-the-art high-brightness, low-CRI semiconductor light emitting devices. As shown by the bivariate fit lines in FIG. 10A, the amount of increase in the luminous flux tended to increase for higher values of ccx, which generally corresponds to lower color temperatures. It is anticipated that by matching the CRI performance at 70 and targeting color points more towards the right hand side of FIGS. 10A and 10B (where the improvement in luminous efficacy performance tends to be higher), the increase in luminous efficacy will be approximately 4%. Moreover, it is expected that as the quantum yield for narrow-spectrum luminescent materials increases, additional improvement will be seen in luminous efficacy performance. It is expected that with higher quantum yields the improvement in luminous efficacy performance will be at least 5-10%. The performance data provided in FIG. 10A was measured when the LEDs were at a temperature of 25 C.

FIG. 10B shows the actual color point of each of the twenty-one semiconductor light emitting devices used to generate FIG. 10A. As shown in FIG. 10B, all of the semiconductor light emitting devices have color points falling around the intersection of the E5 and E6 color bins (the centers of the E5 and E6 color bins are shown in FIG. 10B). As shown in FIG. 10B, there is no discernible difference in the color points of the two different semiconductor light emitting device designs. The correlated color temperatures of the semiconductor light emitting devices used to generate FIG. 10A are all about 3750 K. FIGS. 10A and 10B show that the semiconductor light emitting devices 100 according to embodiments of the present invention may provide an increase in luminous flux while maintaining the same color point and color rendering performance as the conventional semiconductor light emitting device 50.

As noted above, FIG. 10C is a graph comparing the emission spectrum 610 of the semiconductor light emitting devices according to embodiments of the present invention used to generate the data in FIGS. 10A-10B to the emission spectrum 600 of the conventional, high-brightness, low-CRI semiconductor light emitting devices that are used as a basis for comparison in FIGS. 10A and 10B. As shown in FIG. 10C, the emission spectra are similar except for in the 550-640 nm range, where the conventional semiconductor light emitting device exhibits a broad peak while the semiconductor light emitting device according to embodiments of the present invention exhibits a higher, narrower peak.

While in the above-described embodiments, the narrow-spectrum red luminescent material may comprise, for example, red light emitting quantum dots, it will be appreciated that any appropriate red light emitting luminescent material may be used. Examples of such materials include Cd(Se,S) quantum dots, Zn(Se,S) quantum dots, AeLiAl$_3$N$_4$:Eu$^{2+}$ phosphors or SrMg$_3$SiN$_4$:Eu$^{2+}$ phosphors, where Ae is an alkaline-earth element such as calcium or strontium. It will likewise be appreciated that any appropriate green (or yellow) light emitting luminescent material may be for the narrow-spectrum green light emitting luminescent material Examples of such materials include cadmium-zinc quantum dots.

While the above examples describe semiconductor light emitting devices that emit white light having a color temperature of about 4000 K, it will be appreciated that they can likewise be used to fabricate white light emitting devices that have other color temperatures. The techniques discussed herein may be particularly advantageous for semiconductor light emitting devices having correlated color temperatures between 3000-5700 K and more particularly, to semiconductor light emitting devices having correlated color temperatures between 4000-5000 K The data provided in FIG. 10A was measured with the LEDs at room temperature (25° C.). Typically, LEDs operate at higher temperatures such as 55-85° C. due to heat generated in the LEDs. Measurements similar to that shown in FIG. 10A were taken at 55° C. and at 85° C. At 55° C., the luminous efficacy performance of the semiconductor light emitting devices according to embodiments of the present invention dropped by about 1% as compared to the conventional devices, and at 85° C., the luminous efficacy performance of the semiconductor light emitting devices according to embodiments of the present invention dropped by about 2.5% as compared to the conventional devices. In each case the CRI performance of the semiconductor light emitting devices according to embodiments of the present invention was higher by a value of 5 or 6, but this suggests that even if the CRIs were matched the overall improvement in CRI may not be that high.

However, as noted above, the above data was generated using red quantum dots that had quantum yields of only about 74%. As the quantum yields of the red quantum dots (or other narrow-spectrum luminescent material) increases, so should the improvement in luminous efficacy performance.

The semiconductor light emitting devices according to embodiments of the present invention take an unconventional approach to achieving high luminous efficacy for low-CM applications. As explained, for example, in the above-described '875 patent, the use of narrow-spectrum luminescent materials has been suggested as a means of filling in gaps in the emission spectrum such as, for example, a gap that may appear between the peak emission wavelength of a yellow phosphor and the peak emission wavelength of a broad-spectrum red phosphor. Thus, the use of narrow-spectrum luminescent materials has focused on increasing the CRI of a light emitting device. Here, narrow-spectrum luminescent materials are used to increase brightness at the expense of CRI performance to provide high-brightness, low-CM semiconductor light emitting devices.

The semiconductor light emitting devices according to embodiments of the present invention may take advantage of the relatively low contribution that wavelengths above about 620-630 nm have on the CRI value of a light emitting device. Thus, while some red contribution is typically necessary to achieve the necessary CRI values for even low-CM applications, it is possible to provide enough contribution using, for example, a single narrow-spectrum or very narrow emission luminescent material having a peak wavelength in the high wavelengths of the orange color range or the low wavelengths of the red color range. For example, the orange-red luminescent material may emit light at a peak wavelength of less than 625 nm and, in some embodiments, at a peak wavelength of less than 615 nm. This tends to concentrate the red emission at wavelengths where the human eye still has a relatively good response (e.g., at least about 50% of the peak response), which may improve the luminous efficiency of the device. While use of orange-red luminescent materials having relatively low peak wavelengths improves the contribution of the red emission to the overall lumen output of the device, it also may require in some cases shifting the peak wavelength of the green-yellow luminescent material to, for example, about 535-545 nm. This again is a non-intuitive approach, as typically in a high-brightness application the peak wavelength of the yellow-green luminescent material will be set at about 550-560 nm so that it is at or almost at the peak of the eye-response curve of FIG. 2.

Figure 11A:
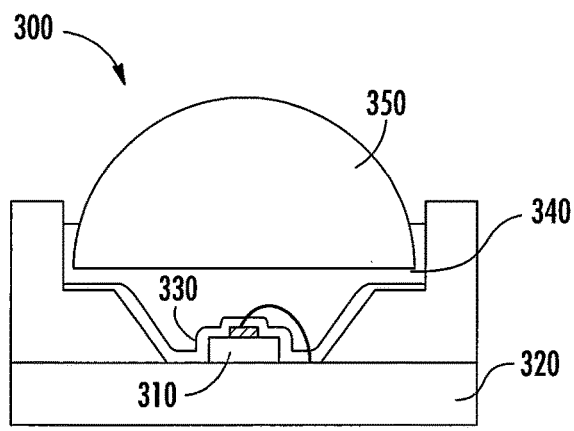
FIGS. 11A-11C are schematic perspective and cross-sectional views of semiconductor light emitting devices according to embodiments of the present invention.
Figure 11B:
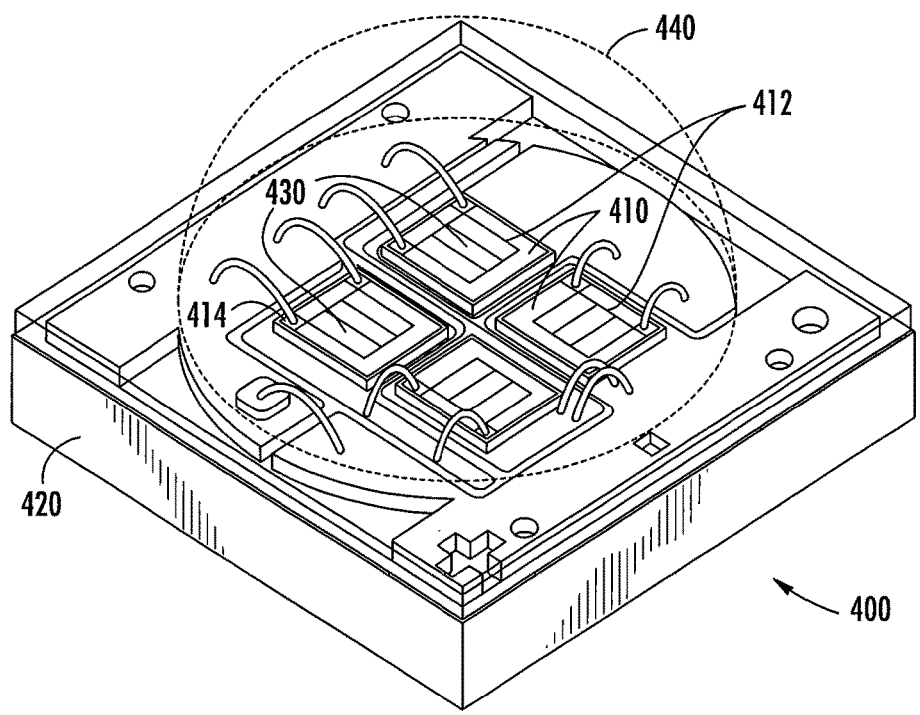
Figure 11C:
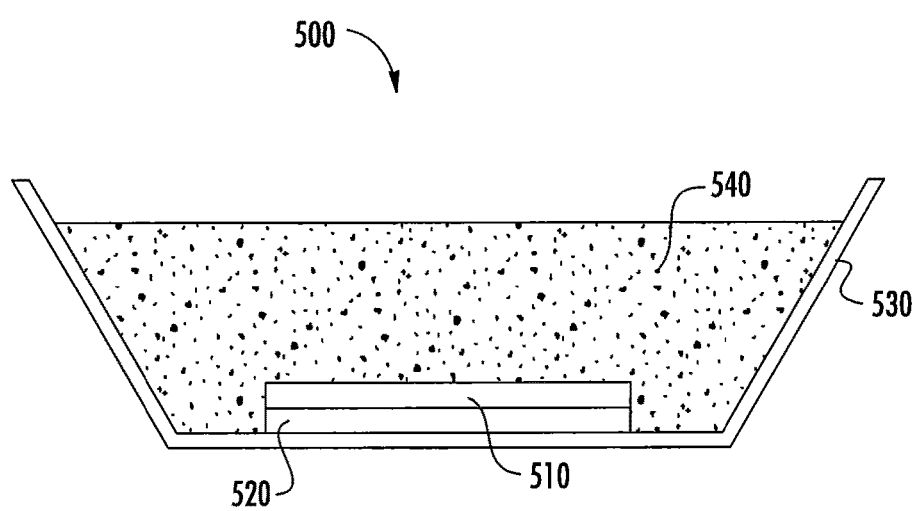

Semiconductor light emitting devices according to embodiments of the present invention will now be described with reference to FIGS. 11A-11C, which illustrate different example implementations of the semiconductor light emitting devices as packaged lamps. It will be appreciated that the example embodiments shown in FIGS. 11A-11C are not limiting, and that the semiconductor light emitting devices according to embodiments of the present invention may be implemented in a wide variety of different ways. Any of the above-described semiconductor light emitting devices may be packaged in the ways shown in any of FIGS. 11A-11C.

FIG. 11A is a side schematic view of a semiconductor light emitting device 300 that includes an LED 310 that is mounted on a mounting surface 320. The LED 310 may comprise, for example, an LED that emits radiation having a dominant wavelength in the blue color range (e.g., radiation with a dominant wavelength of between 440 to 475 nanometers). A recipient luminophoric medium 330 is provided that is positioned to receive light that is emitted by the LED 310. The luminophoric medium 330 may comprise an encapsulant material such as, for example, silicone that has luminescent materials suspended therein. In the embodiment pictured in FIG. 11A, the recipient luminophoric medium 330 is conformally coated on an upper and side surfaces of the LED 310 and on the mounting surface 320 and sidewalls of a reflector cup. It will be appreciated, however, that the recipient luminophoric medium 330 may be placed in other locations. For example, in other embodiments, the recipient luminophoric medium 330 may be coated on an interior and/or exterior surface of a lens 350, embodied as an encapsulant material that is provided between the LED 310 and the lens 350 or in any other suitable location where the recipient luminophoric medium 330 may receive at least some of the light emitted by the LED 310 and convert at least some of the emitted light to light having different wavelengths. The recipient luminophoric medium 330 may be any of the above-described recipient luminophoric mediums according to embodiments of the present invention. The blue LED 310 is shown as having a topside contact, but may comprise a flip-chip LED in other embodiments.

FIG. 11B is a perspective view of a semiconductor light emitting device 400 according to further embodiments of the present invention. As shown in FIG. 11B, the semiconductor light emitting device 400 includes a substrate/submount ("submount") 420 on which four LED chips or "die" 410 are mounted. The LEDs 410 may be mounted in flip chip configuration in some embodiments. The submount 420 can be formed of many different materials such as, for example, aluminum oxide, aluminum nitride, organic insulators, a printed circuit board (PCB), sapphire or silicon.

The LEDs 410 may each include a conductive current spreading structure 412 on the respective top surfaces thereof, as well as one or more contacts 414 that are accessible at its top surface for wire bonding. In other embodiments, one or both contacts 414 for each LED 410 may be on a bottom side of the LED. The current spreading structure 412 may comprise conductive fingers that are arranged in a pattern on each LED 410 with the fingers spaced to enhance current spreading from the contacts 414 into the top surface of the LEDs 410.

The LEDs 410 may be coated with a recipient luminophoric medium 430 according to embodiments of the present invention. The recipient luminophoric medium 430 may comprise any of the recipient luminophoric mediums discussed in the present application. The recipient luminophoric medium 430 may be coated on the LEDS 410, and may also be coated on portions of the submount 420 such as, for example, portions between the LEDs 410. The recipient luminophoric medium 430 may be coated on the LEDs 410 using many different methods, including, for example, electrophoretic deposition and/or spray coating. The recipient luminophoric medium 430 may be applied at the wafer level or alternatively may be applied to the LEDs 410 after the LEDs 410 have been singulated and mounted on the mounting substrate 420.

An optical element or lens 440 is formed over at least part of the top surface of the submount 420 to enclose the LEDs 410 and provide both environmental and/or mechanical protection therefore. The lens 440 can be many different shapes such as, for example, hemispheric. Many different materials can be used for the lens 440 such as silicones, plastics, epoxies or glass. The lens 440 can also be textured to improve light extraction. In some embodiments, the lens 440 may comprise the recipient luminophoric medium 430 and/or may be used to hold a luminophoric medium 430 in place over the LEDs 410 instead of and/or in addition to coating a luminophoric medium 430 directly onto the LED chips 410.

FIG. 11C illustrates another example implementation of the above described semiconductor light emitting device 500 in which a blue LED 510 is mounted on a mounting substrate 520 and surrounded by a reflector cup 530, and the recipient luminophoric medium 540 is deposited on the LED 510 within the reflector cup 530. The recipient luminophoric medium 540 may include all both the first and second luminescent materials mixed together.

The above-described semiconductor light emitting devices according to embodiments of the present invention may exhibit high brightness while meeting minimum CRI performance criteria for low-CRI applications. These semiconductor light emitting devices may be incorporated into components, bulbs and/or fixtures that do not include any red light emitting LEDs.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

The present invention has been described above with reference to the accompanying drawings, in which certain embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that, when used in this specification, the terms "comprises" and/or "including" and derivatives thereof, specify the presence of stated features, operations, elements, and/or components, but do not preclude the presence or addition of one or more other features, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions and/or layers, these elements, components, regions and/or layers should not be limited by these terms. These terms are only used to distinguish one element, component, region or layer from another element, component, region or layer. Thus, a first element, component, region or layer discussed below could be termed a second element, component, region or layer without departing from the teachings of the present invention.

Furthermore, relative terms, such as "lower" or "bottom" and "upper" or "top," may be used herein to describe one element's relationship to another element as illustrated in the figures. It will be understood that relative terms are intended to encompass different orientations of the device in addition to the orientation depicted in the figures. For example, if the device in the figures is turned over, elements described as being on the "lower" side of other elements would then be oriented on "upper" sides of the other elements. The exemplary term "lower", can therefore, encompasses both an orientation of "lower" and "upper," depending on the particular orientation of the figure.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A semiconductor light emitting device, comprising:
a light emitting diode ("LED"); and
a recipient luminophoric medium that is configured to down-convert at least some of the light emitted by the LED, the recipient luminophoric medium including at least:
a first luminescent material that down-converts a first portion of the radiation emitted by the LED to radiation having a first peak wavelength that is in a green-yellow color range, the first luminescent material having a full-width half maximum spectral width of less than 70 nanometers;
a second luminescent material that down-converts a second portion of the radiation emitted by the LED to radiation having a second peak wavelength that is in an orange-red color range, the second luminescent material having a full-width half maximum spectral width of less than 70 nanometers,
wherein the first luminescent material, the second luminescent material and any additional luminescent materials that have a full-width half maximum spectral width of less than 70 nanometers that are included in the recipient luminophoric medium generate at least 80% of the light emitted by the recipient luminophoric medium, and
wherein a CRI value of the combined light emitted by the semiconductor light emitting device is at least 60 and less than 80.

2. The semiconductor light emitting device of claim 1, wherein the recipient luminophoric medium does not include any luminescent materials that have a full-width half maximum spectral width that exceeds 70 nanometers.

3. The semiconductor light emitting device of claim 1, wherein the peak wavelength of the first luminescent material is between 530 nm and 548 nm.

4. The semiconductor light emitting device of claim 1, wherein the first and second luminescent materials are the only luminescent materials included in the recipient luminophoric medium.

5. The semiconductor light emitting device of claim 4, wherein the peak wavelength of the second luminescent material is between 60-70 nanometers greater than the peak wavelength of the first luminescent material.

6. The semiconductor light emitting device of claim 1, wherein a peak emission power of the first luminescent material when excited by light from the LED is less than a peak emission power of the second luminescent material when excited by light from the LED.

7. The semiconductor light emitting device of claim 6, wherein a peak emission power of the light emitted by the LED that passes through the recipient luminophoric medium is less than a peak emission power of the second luminescent material when excited by light from the LED.

8. The semiconductor light emitting device of claim 7, wherein a peak emission power of the light emitted by the LED that passes through the recipient luminophoric medium is less than a peak emission power of the first luminescent material when excited by light from the LED.

9. The semiconductor light emitting device of claim 1, wherein the CRI value of the combined light emitted by the semiconductor light emitting device is between 69 and 75.

10. The semiconductor light emitting device of claim 9, wherein the light output by the semiconductor light emitting device has a correlated color temperature of between 3900 K and 5700 K.

11. The semiconductor light emitting device of claim 10, wherein the peak wavelength of the second luminescent material is between 595 nm and 612 nm.

12. A semiconductor light emitting device, comprising:
a light emitting diode ("LED"); and
a recipient luminophoric medium that is configured to down-convert at least some of the light emitted by the LED, the recipient luminophoric medium including at least:
a first luminescent material that down-converts a first portion of the radiation emitted by the LED to radiation having a peak wavelength that is in a green-yellow color range, the first luminescent material having a full-width half maximum spectral width of at least 80 nanometers;
one or more second luminescent materials that each down-convert a second portion of the radiation emitted by the LED to radiation having a peak wavelength that is in an orange-red color range, each second luminescent material having a full-width half maximum spectral width of less than 45 nanometers,
wherein the one or more second luminescent materials generate at least 80% of the light emitted by luminescent materials included in the recipient luminophoric medium that have peak wavelengths above 590 nm, and
wherein a peak emission of the first luminescent material when excited by light from the LED exceeds a peak emission of each second luminescent material when excited by light from the LED,
wherein a CRI value of the combined light emitted by the semiconductor light emitting device is at least 60 and less than 80.

13. The semiconductor light emitting device of claim 12, wherein the emission power of each second luminescent material when excited by light from the LED is less than the emission power of the first luminescent material when excited by light from the LED at all wavelengths in the visible light spectrum.

14. The semiconductor light emitting device of claim 12, wherein the peak wavelength of the first luminescent material is between 530 nm and 548 nm.

15. The semiconductor light emitting device of claim 12, wherein the CRI value of the combined light emitted by the semiconductor light emitting device is between 69 and 75.

16. The semiconductor light emitting device of claim 15, wherein the semiconductor light emitting device only includes a single second luminescent material, and wherein the peak wavelength of the second luminescent material is between 595 nm and 612 nm.

17. A semiconductor light emitting device, comprising:
a light emitting diode ("LED"); and
a recipient luminophoric medium that is configured to down-convert at least some of the light emitted by the LED, the recipient luminophoric medium including:
a first luminescent material that down-converts a first portion of the radiation emitted by the LED to radiation having a first peak wavelength that is in a green-yellow color range, the first luminescent material having a full-width half maximum spectral width of less than 45 nanometers;
a second luminescent material that down-converts a second portion of the radiation emitted by the LED to radiation having a second peak wavelength that is in an orange-red color range, the second luminescent material having a full-width half maximum spectral width of less than 45 nanometers, wherein a peak emission power of the light emitted by the LED that passes through the recipient luminophoric medium is less than a peak emission power of the first luminescent material when excited by light from the LED and is less than a peak emission power of the second luminescent material when excited by light from the LED, wherein a CRI value of the combined light emitted by the semiconductor light emitting device is at least 60 and less than 80, and wherein the first and second luminescent materials are the only luminescent materials included in the recipient luminophoric medium.

18. The semiconductor light emitting device of claim 17, wherein the peak wavelength of the second luminescent material is between 60-70 nanometers greater than the peak wavelength of the first luminescent material.

19. The semiconductor light emitting device of claim 18, wherein the CRI value of the combined light emitted by the semiconductor light emitting device is between 69 and 75.

20. The semiconductor light emitting device of claim 19, wherein the peak wavelength of the second luminescent material is between 595 nm and 612 nm.

21. The semiconductor light emitting device of claim 20, wherein the peak wavelength of the first luminescent material is between 530 nm and 548 nm.

* * * * *

UNITED STATES PATENT AND TRADEMARK OFFICE
CERTIFICATE OF CORRECTION

PATENT NO.         : 9,905,735 B1
APPLICATION NO.    : 15/475366
DATED              : February 27, 2018
INVENTOR(S)        : Tudorica et al.

It is certified that error appears in the above-identified patent and that said Letters Patent is hereby corrected as shown below:

In the Specification

Column 21, Line 11: Please correct "O" to read -- 0 --

Column 25, Line 47: Please correct "low-CM" to read -- low-CRI --

Column 25, Line 58: Please correct "low-CM" to read -- low-CRI --

Column 25, Line 64: Please correct "low-CM" to read -- low-CRI --

Signed and Sealed this
Nineteenth Day of June, 2018

Andrei Iancu
*Director of the United States Patent and Trademark Office*